(12) United States Patent
Ullrich et al.

(10) Patent No.: US 10,831,332 B2
(45) Date of Patent: Nov. 10, 2020

(54) USER INTERFACE ELEMENT FOR BUILDING INTERIOR PREVIEWING AND NAVIGATION

(71) Applicants: Oliver Ullrich, Miami, FL (US);
Naphtali Rishe, Miami Beach, FL (US); Victor Potapenko, Miami, FL (US)

(72) Inventors: Oliver Ullrich, Miami, FL (US);
Naphtali Rishe, Miami Beach, FL (US); Victor Potapenko, Miami, FL (US)

(73) Assignee: The Florida International University Board of Trustees, Miami, FL (US)

( * ) Notice: Subject to any disclaimer, the term of this patent is extended or adjusted under 35 U.S.C. 154(b) by 360 days.

(21) Appl. No.: 15/440,524

(22) Filed: Feb. 23, 2017

(65) Prior Publication Data
US 2018/0239513 A1 Aug. 23, 2018

(51) Int. Cl.
*G06F 3/0481* (2013.01)
*G06F 3/0488* (2013.01)
*G06F 3/0484* (2013.01)
*G06F 30/13* (2020.01)

(52) U.S. Cl.
CPC ...... *G06F 3/04815* (2013.01); *G06F 3/04845* (2013.01); *G06F 3/04883* (2013.01); *G06F 30/13* (2020.01); *G06F 2203/04808* (2013.01)

(58) Field of Classification Search
CPC ............ G06F 3/04815; G06F 3/04845; G06F 3/04883; G06F 17/50; G06F 2203/04808; G06F 30/13

USPC ............... 715/764, 765, 766, 773, 781, 782
See application file for complete search history.

(56) References Cited

U.S. PATENT DOCUMENTS

| | | | |
|---|---|---|---|
| 6,602,475 B1 * | 8/2003 | Chiao | A61L 9/035 222/146.5 |
| 7,409,392 B2 * | 8/2008 | Greer | G06Q 10/06 |
| 7,954,070 B2 * | 5/2011 | Plocher | G08B 25/14 700/13 |
| 8,233,008 B2 * | 7/2012 | Jin | G06T 19/20 345/619 |
| 8,464,181 B1 * | 6/2013 | Bailiang | G06F 3/04815 715/848 |

(Continued)

OTHER PUBLICATIONS

"flip;" Nov. 25, 2016, Dictionary.com; pp. 1-10.*

*Primary Examiner* — Andrew R Dyer
(74) *Attorney, Agent, or Firm* — Saliwanchik, Lloyd & Eisenschenk

(57) ABSTRACT

Methods of communicating, displaying, and storing information relating to structures, as well as apparatuses for executing such methods, are provided. The methods can be executed on touchscreen electronic devices and may be particularly useful for shopping center, cruise ship, museum, and construction applications. The methods and apparatuses allow for, for example, reviewing a building's interior, finding information on areas within a building, and navigating from a current location to a destination. A method can include defining a structure using elements, wherein the elements are three dimensional shapes, and manipulating the elements or the structure on a user interface. A user is therefore able to obtain important information about the structure clearly and effortlessly.

18 Claims, 34 Drawing Sheets

(56) References Cited

U.S. PATENT DOCUMENTS

| | | | | |
|---|---|---|---|---|
| 8,977,558 | B2* | 3/2015 | Nielsen | G06Q 10/103 |
| | | | | 705/7.42 |
| 9,959,026 | B2* | 5/2018 | Adams | G06F 3/0482 |
| 9,959,463 | B2* | 5/2018 | Rafii | G06K 9/00389 |
| 10,241,582 | B2* | 3/2019 | Noda | G06F 3/011 |
| 2005/0195173 | A1* | 9/2005 | McKay | G06F 1/16 |
| | | | | 345/173 |
| 2008/0094370 | A1* | 4/2008 | Ording | G06F 3/04883 |
| | | | | 345/173 |
| 2008/0301102 | A1* | 12/2008 | Liang | G06Q 10/08 |
| 2011/0153279 | A1* | 6/2011 | Zhang | G06F 17/5004 |
| | | | | 703/1 |
| 2011/0285665 | A1* | 11/2011 | Matsumoto | G06F 3/044 |
| | | | | 345/174 |
| 2013/0036387 | A1* | 2/2013 | Murata | G06F 3/04883 |
| | | | | 715/841 |
| 2013/0144583 | A1* | 6/2013 | Hemanthkumar | E21B 41/00 |
| | | | | 703/10 |
| 2013/0218890 | A1* | 8/2013 | Fernandes | G06Q 50/163 |
| | | | | 707/736 |
| 2013/0317944 | A1* | 11/2013 | Huang | G01S 5/0252 |
| | | | | 705/26.61 |
| 2014/0245232 | A1* | 8/2014 | Bailiang | G06F 3/04815 |
| | | | | 715/850 |
| 2016/0098094 | A1* | 4/2016 | Minkkinen | G06F 3/017 |
| | | | | 345/156 |
| 2016/0239080 | A1* | 8/2016 | Marcolina | G06F 3/011 |
| 2017/0131782 | A1* | 5/2017 | Cardy | G06F 3/017 |
| 2017/0140552 | A1* | 5/2017 | Woo | G06F 1/163 |
| 2017/0230930 | A1* | 8/2017 | Frey | H04W 4/80 |

* cited by examiner

USER INTERFACE ELEMENT FOR BUILDING INTERIOR PREVIEWING AND NAVIGATION

STATEMENT OF GOVERNMENT SUPPORT

This invention was made with government support under grant number IIS-1213026 awarded by the National Science Foundation. The government has certain rights in the invention.

BACKGROUND

Shopping centers, cruise ships, museums, and other places the general public frequent commonly have maps and kiosks available to assist their customers in their search for products, stores, and general navigation. However, these kiosks and maps tend to have limited information available to the user as they are not interactive. Therefore, there is a need for new methods and apparatuses that make navigation easier, as well as disseminate useful information to guests.

BRIEF SUMMARY

The present invention relates to interactive user interfaces for communicating, displaying, and storing information relating to structures. Embodiments of the present invention include methods of communicating, displaying, and storing information relating to structures, as well as apparatuses for executing such methods. The methods can be executed on touchscreen electronic devices. The methods and apparatuses allow for, for example, reviewing a building's interior, finding information on areas within a building, and navigating from a current location to a destination.

A method according to an embodiment of the present invention can include defining a structure using elements, wherein the elements are three dimensional shapes, and manipulating the elements or the structure on a user interface. The method can be implemented on a touch screen user interface. Alternatively, the method can be executed by way of a keyboard, buttons, or a remote means, such as gesture recognizing glove. The method can be implemented on a personal device (e.g., a phone, tablet, or computer) or a public kiosk.

Two fingers can be used to separate or move two elements by putting a first finger on a first element and a second finger on a second element and separating the first and second fingers (or moving the first and second fingers away from each other). The elements may also be placed and left in a new location after removing the fingers from the touch screen. A single element, multiple elements, or the entire structure can be locked in place (i.e., in a specific relative orientation) and be moved and rotated horizontally, vertically, or in all three dimensions (e.g., by using the touch screen or by using arrow buttons).

One or more elements can be moved by placing a finger on each of the elements and moving the finger on the touch screen. Instead of directly touching the elements, the elements can be selected by selecting an icon (e.g., a categorized list of elements that is adjacent to the structure). A legend can be included that shows scale (dimensions relative to real-world dimensions) as well as the meaning of other symbols used within the display of the structure.

Instead of a touchscreen, embodiments of the present invention can be implemented using a virtual reality headset. Particularly useful in virtual reality situations, gloves or an implement can be used to detect physical gestures of a user's hand and manipulate the elements or the structure (in all the same ways that can be done using fingers on a touch screen, as mentioned above). For example, the user can separate two elements using fingers and then place the palm between the two elements and further separate the elements using the palm.

Embodiments of the present invention can include a button or icon that can return all elements to their original position and an icon that can explode the structure, separating some or all of its elements. There can be multiple icons that explode (or separate) different groups of elements (e.g., a first floor of a shopping center), or explode a structure into categorized elements. For example, there can be multiple explode icons, e.g., separating the structure by floors or units, separating the structure into all of its elements, separating the elements based on their category.

A unit including multiple elements, but not the entire structure, can be selected (e.g., by selecting an icon that represents the unit or by choosing multiple elements to form a unit) and the remaining structure can be removed to emphasize the unit. A user's location within the structure, a unit, or an element can be shown. The user can select a destination and directions can be provided from the user's current location to the destination, and distances can also be included. The user's direction of travel can also be shown.

Elements can contain sub-elements. For example, the structure can be a shopping mall, the elements can be stores, and the sub-elements can be departments within the store. The structure, the elements, and the sub-elements can be selected and prompted to display additional information about the sub-elements. Specific locations within the structure and elements can be saved or tagged and notes can be provided with the tagged items.

Embodiments of the present invention can be applied to a shopping center or the retail industry. A list of stores organized by category can be adjacent to the structure on the user interface. Highlighting a category can highlight all stores (or elements) within that category. Selecting a store can show the departments within the store, and further information about the store can be given including the type of store and price category.

Embodiments of the present invention can be applied to the construction industry. For example, a general contractor can view elements such as rooms, foundations, kitchen cabinets, windows, doors, floors, stairs, and roofs. Information can be displayed including materials of construction, current status of completion by percentage and time, date of beginning and ending work, cost of each element of the structure and total cost of the structure, and information regarding sub-contractors including contact information. The user can update the application by entering information using the touch screen or a remote means. Information from multiple sources (e.g., a stationary PC and a mobile device) can be synced.

The structure and the elements can include photographic textures. A zoom feature for enlarging or reducing the size of the structure or elements can be provided. The zoom feature can be implemented via spreading or contracting two points of contact on the touch screen or by using "zoom in" and "zoom out" icons. The touch screen display can also include symbols that indicate restrooms, emergency exits and exit paths, stairs, elevators and other important facilities within the structure.

DETAILED DESCRIPTION

Figure 1:
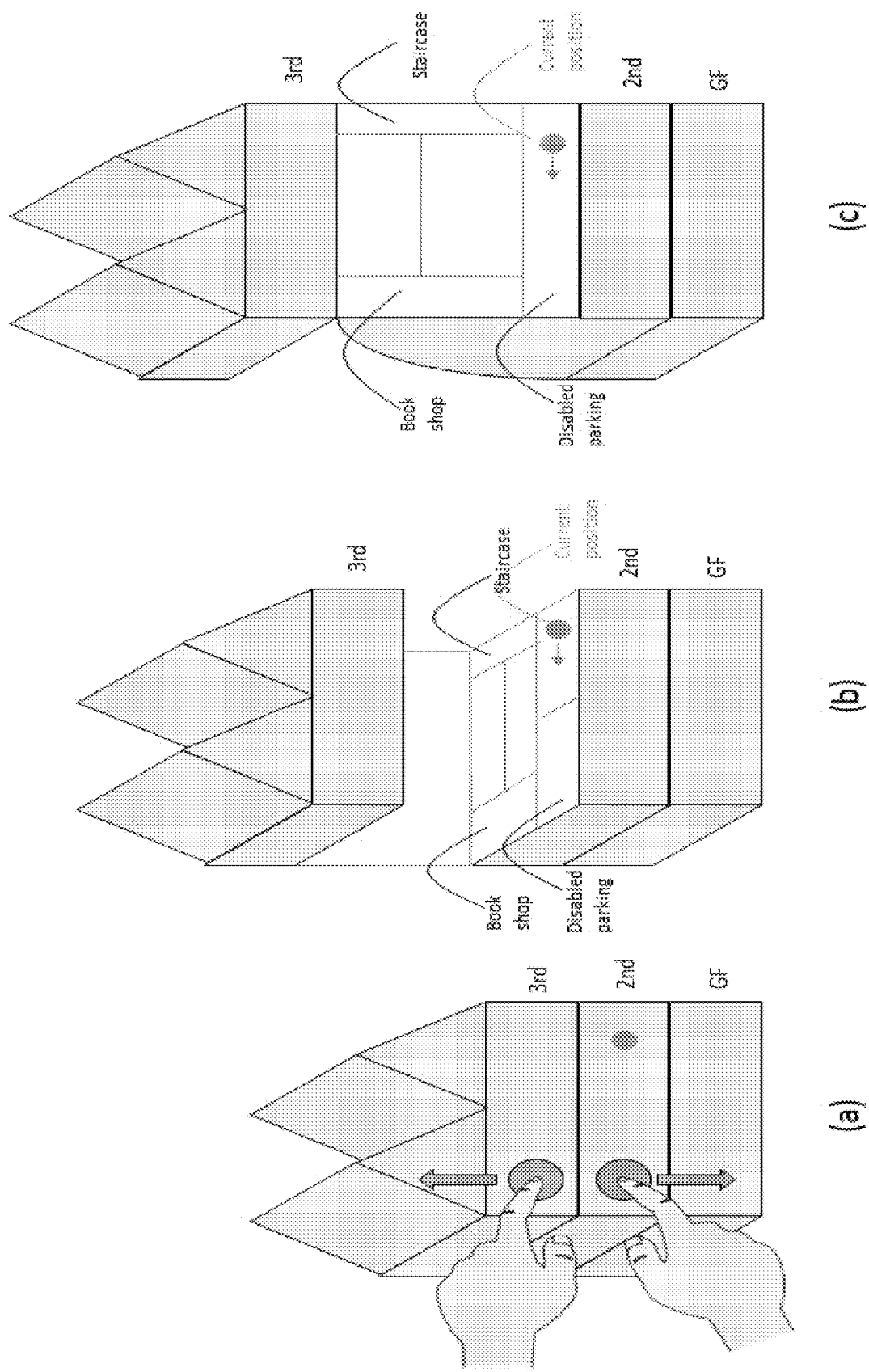
FIG. 1 is a diagram of a user interface showing (a) a closed view; (b) a mock-perspective view of one floor; and (c) a top-down view of one floor.

Embodiments of the present invention include methods of communicating, displaying, and storing information relating to structures as well as apparatuses for executing such methods. In its deactivated mode, a touch-screen user interface according to the present invention depicts a view of one or more buildings, as seen in FIG. 1. The depiction can be perspectively correct, drawn in a simplified mock-perspective view as in FIG. 1 (a), or in a full frontal top-down view. The depiction can be a simplified outline of a building, or a complete outline with drawn or photographic textures. The depiction can include a marker displaying a user's location, and other markers depicting previously saved positions. The depiction can be comprised of a structure, which includes elements. Multiple elements can be combined to form units.

Figure 2:
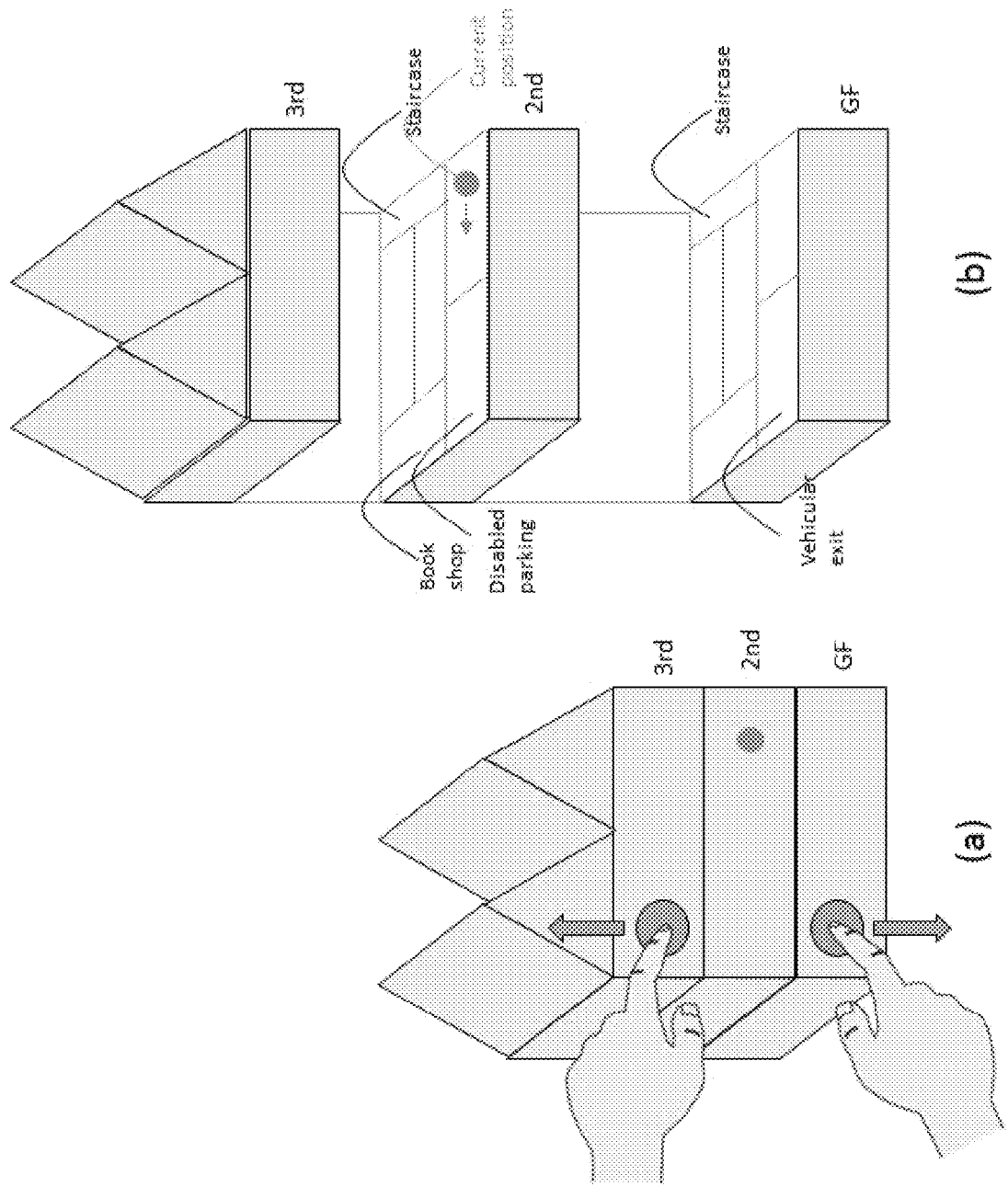
FIG. 2 shows a diagram of a user interface having (a) a closed view; and (b) two floors open.

Elements can be activated in a multitude of ways. For example, elements can be activated by: sliding and releasing two adjacent floors apart with a two-finger gesture (see FIG. 1(a)); sliding and releasing two or more floors, or separating the entire structure apart with a two-finger gesture (see FIG. 2 (a)); sliding and releasing the subjacent floor down with a one-finger gesture; sliding and releasing the overlying floor up with a one-finger gesture; sliding and releasing the entire structure up or down with a one-finger gesture; pressing the desired floor with one finger; pressing a text label describing the floor (e.g. a "2nd floor"); sliding and holding two adjacent floors apart with a two-finger gesture (see FIG. 1 (a)); sliding and holding the overlying floor up with a one-finger gesture; sliding and holding the entire structure up with a one-finger gesture; sliding and holding the entire structure down with a one-finger gesture; sliding and holding two adjacent floors apart with a two-finger gesture (see FIG. 1 (a)) and rotating the entire structure left or right; sliding and holding the overlying floor up with a one-finger gesture, and rotating the entire structure left or right; sliding and holding the entire structure up with a one-finger gesture, and rotating the entire structure left or right; and sliding and holding the entire structure down with a one-finger gesture, and rotating the entire structure left or right.

This activation process can have the elements of the depiction slide and move in various directions. Furthermore, a map or outline of the desired floor or floors can be displayed. The outline can have the correct perspective, or it can be drawn in a simplified mock-perspective view (see FIG. 1 (*b*) and FIG. 2(*b*)), or in a conventional top-down view (see FIG. 1 (*c*)), or at an angle in between. For example, the angle of the floors' depiction might change with the distance the finger(s) move with an opening gesture.

The map, depiction, or user interface can have multiple attributes. For example, descriptive text or glyphic labels can be added for locations, facilities or areas; markers can be provided showing the current position of a user; markers can be provided to communicate scale; markers, lines or curves can be shown representing a user's path or a suggested path; an arrow or marker can be provided showing a user's current heading or direction; previously saved user locations can be listed and marked on the user interface; and graphical and textual elements showing options for reaching adjacent floors, including stairs, elevators, and ladders can be provided.

A user may peruse a particular depiction or orientation. In addition, the user interface can allow for: requesting a path from a current location to a destination by pressing on a desired destination's location, or a destination's descriptive label, or a destination's area; increasing or decreasing the representation's level of detail by opening or closing and element; rotating an entire structure left or right by, for example, pressing and holding, or maintaining a hold on the depiction, with a one- or two-finger-gesture; opening one or more other floors by finger gestures; and deactivating the element.

A displayed floor can be changed, or one or more additional floors can be displayed by: sliding apart two other floors with a two-finger gesture; sliding a subjacent floor down with a one-finger gesture; sliding an overlying floor up with a one-finger gesture; pressing on the depiction of a floor; and/or pressing the descriptive label corresponding to a floor. An element can be deactivated by, for example, sliding elements back together with a two-finger gesture; sliding a subjacent floor up with a one-finger gesture; sliding an overlying floor down with a one-finger gesture; pressing the empty area around the element; and by releasing the finger(s) from the screen.

The described touch-screen user interface can be similarly implemented in a virtual reality (VR), or augmented reality (AR) environment. In both VR and AR environments, the activation, interaction and deactivation can be performed in a similar way as with touch-screens, with the exception of gestures. Depending on the specific hardware used to interact with the environment, the user may use one- or two-finger gestures, if the structure is relatively small (or far away), to perform all of the activation/interaction/deactivation procedures described above in the exact same way the user would interact with the touch screen. Furthermore, users may engage the palms of their hands to perform similar actions when the building is large (or close to the user). For example, the user may use a grab gesture to grab two adjacent floors and pull them apart exposing the floor map or view. Alternatively, the user can slide an open palm between the floors and move them up or down exposing the floor map or view. The user can slide two open palms between the floors and push them apart. The user can grab the building (e.g., the roof of the building) using the grab gesture and pull it upward exposing all of the building levels, or pull it downward in a similar fashion, or use both hands to pull it in both directions. The user can also turn the building by using a hand gesture that is similar to twisting a cap off a bottle. This gesture can be used to expose more of the floor map or get a sense of direction based on a position marker. The application of this UI element in virtual and augmented realities allows users to have highly intuitive interactions with virtual or augmented real world objects such as buildings, parking garages, and other large or small sized objects with level based structures.

The object used as an example in this application is a multi-level building structure. Any object that contains one or more levels in which each level has a more detailed representation obstructed from view can be explored using the herein presented user interface for interior preview. For example, a collection of real estate listings represented by icons with photos and multiple categories for each listing can display information and details underneath. Each information category can act as a separate level. Without selecting an individual listing for a full detailed view, a user may use a two-finger gesture to slide apart all of the information categories and expose the underlying information. The interface presented in this disclosure can be applied to a multitude of objects that exhibit multi-level structures as well, whether they are representations of real world objects or abstract objects. FIGS. 4A-17B depict various embodiments and features of embodiments of the claimed invention, as fully described herein and as stated in the description of these figures in the Brief Description of Drawings section.

The methods and processes described herein can be embodied as code and/or data. The software code and data described herein can be stored on one or more computer-readable media or machine-readable media, which may include any device or medium that can store code and/or data for use by a computer system. When a computer system reads and executes the code and/or data stored on a computer-readable medium, the computer system performs the methods and processes embodied as data structures and code stored within the computer-readable storage medium.

It should be appreciated by those skilled in the art that computer-readable media include removable and non-removable structures/devices that can be used for storage of information, such as computer-readable instructions, data structures, program modules, and other data used by a computing system/environment. A computer-readable medium includes, but is not limited to, volatile memory such as random access memories (RAM, DRAM, SRAM); and non-volatile memory such as flash memory, various read-only-memories (ROM, PROM, EPROM, EEPROM), magnetic and ferromagnetic/ferroelectric memories (MRAM, FeRAM), and magnetic and optical storage devices (hard drives, magnetic tape, CDs, DVDs); network devices; or other media now known or later developed that is capable of storing computer-readable information/data. Computer-readable media should not be construed or interpreted to include any propagating signals. A computer-readable medium of the subject invention can be, for example, a compact disc (CD), digital video disc (DVD), flash memory device, volatile memory, or a hard disk drive (HDD), such as an external HDD or the HDD of a computing device, though embodiments are not limited thereto. A computing device can be, for example, a laptop computer, desktop computer, server, cell phone, or tablet, though embodiments are not limited thereto.

Figure 3:
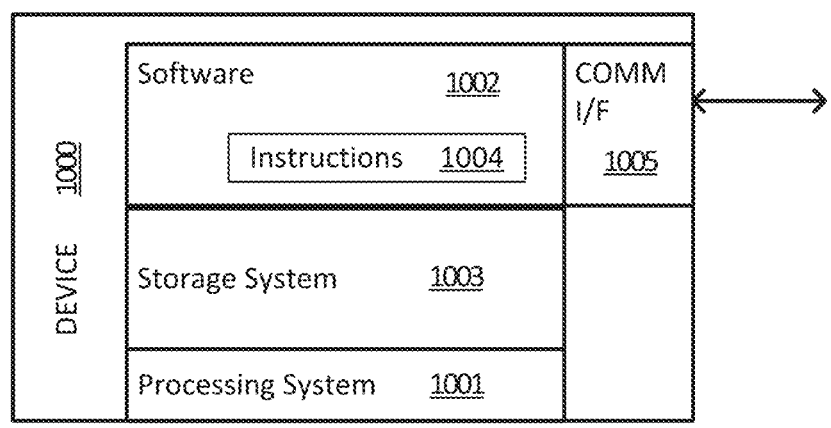
FIG. 3 shows the structure of a computing device (e.g., a phone, tablet, PC, or electronic kiosk) according to the present invention.
Figure 4A:
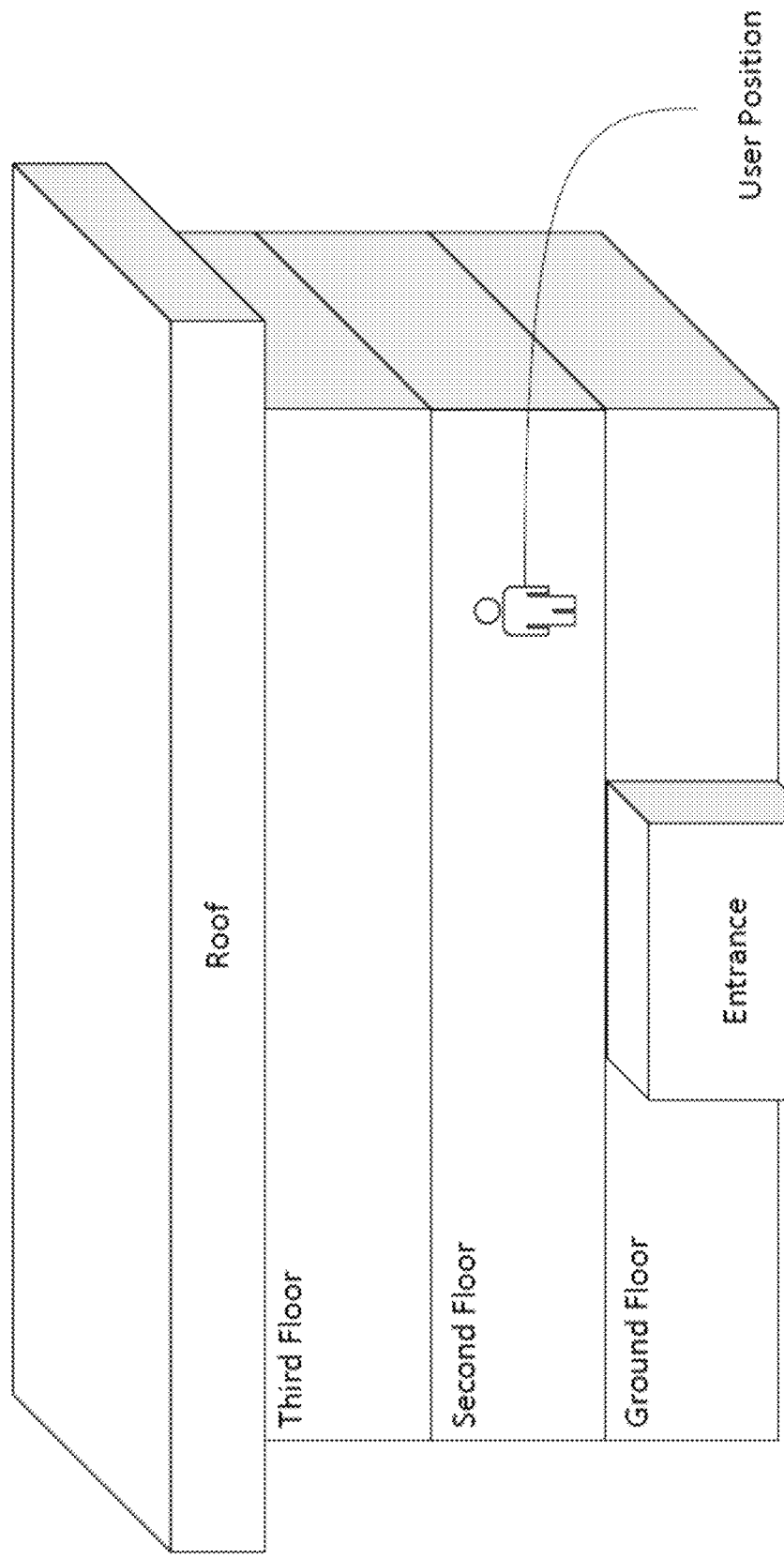
FIG. 4A is a diagram of a user interface showing a shopping center in a closed position.
Figure 4B:
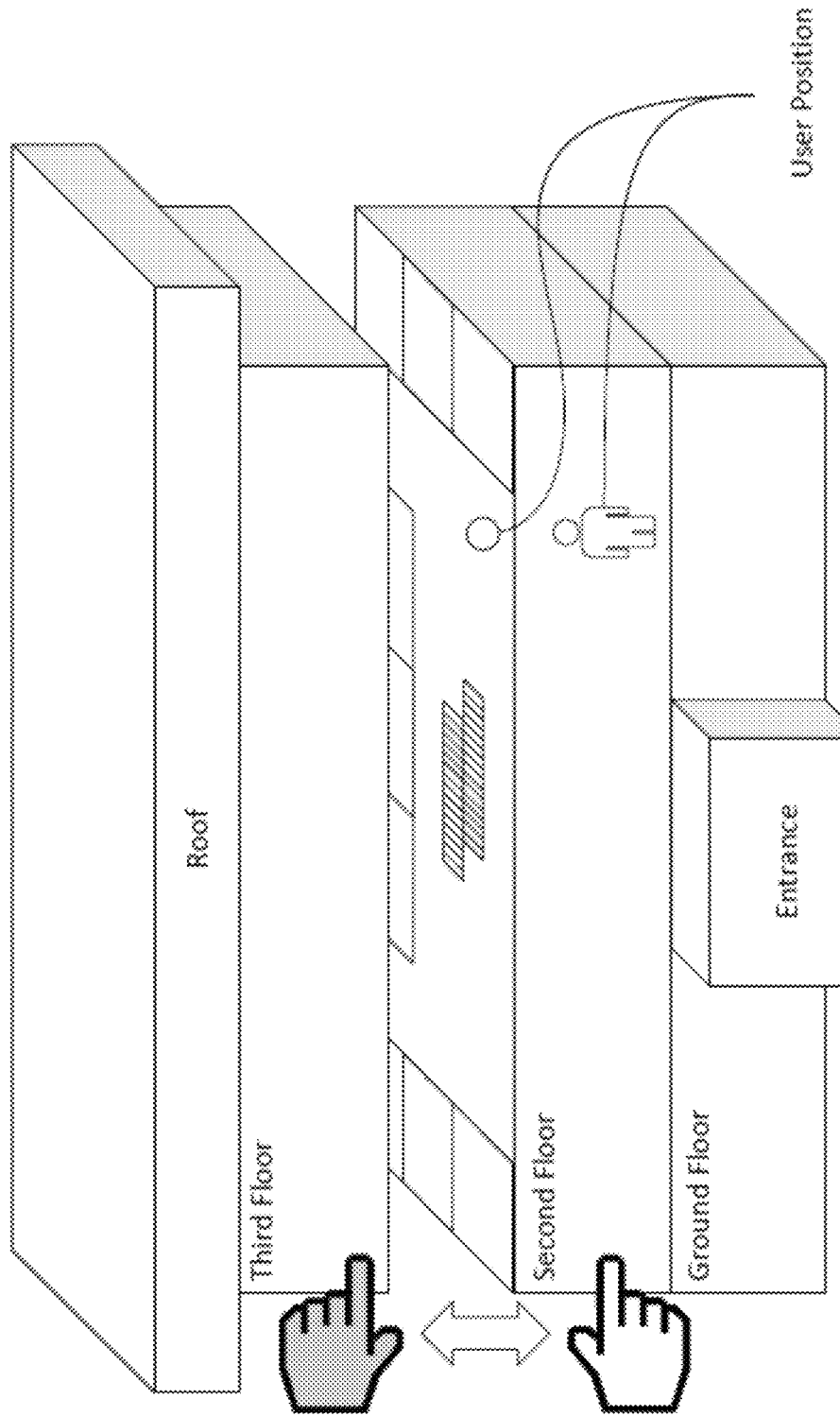
FIG. 4B is a diagram of a user interface showing a shopping center in a first opened position.
Figure 4C:
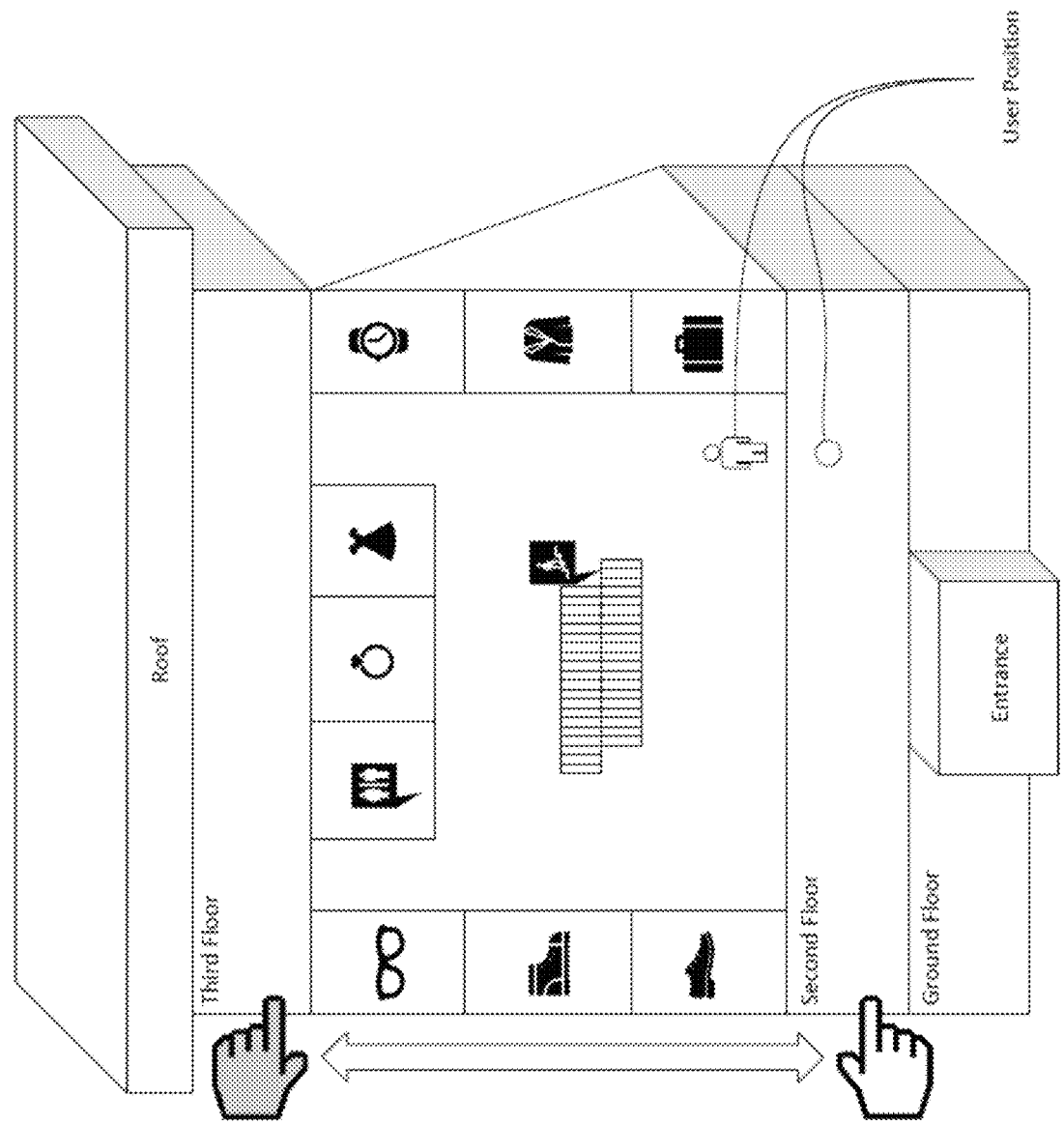
FIG. 4C is a diagram of a user interface showing a shopping center in a second opened position.
Figure 4D:
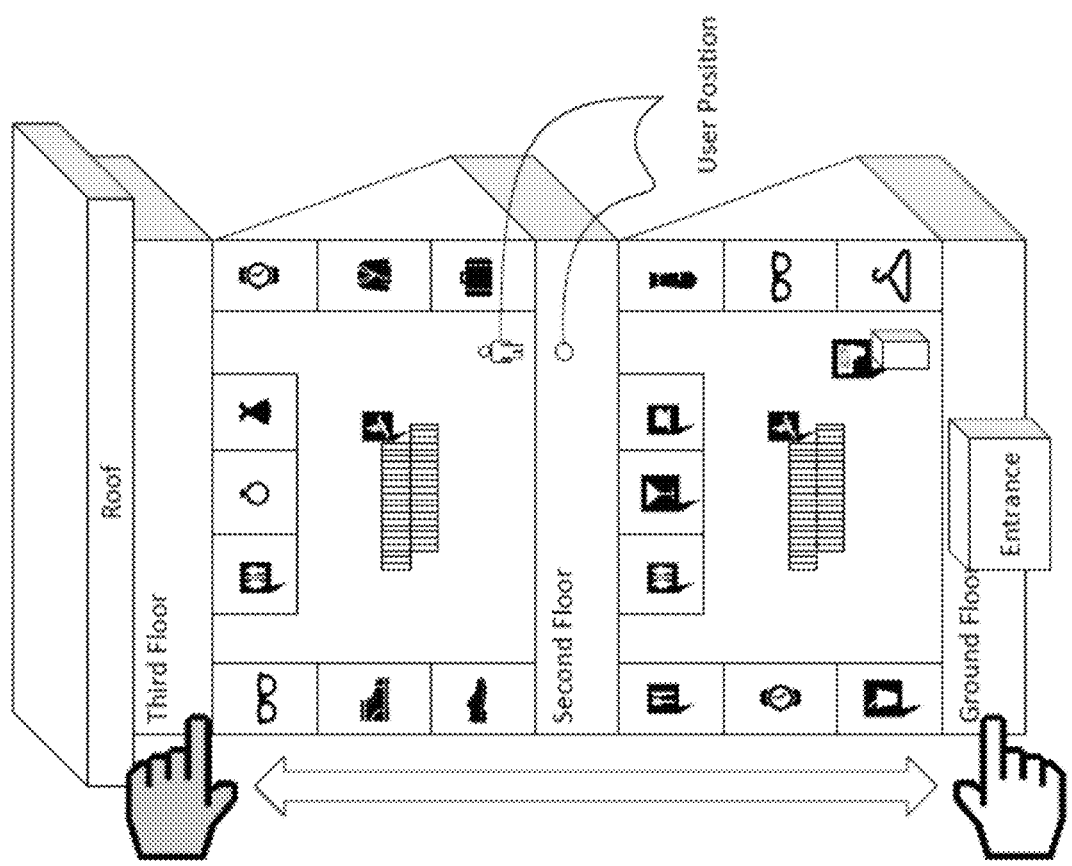
FIG. 4D is a diagram of a user interface showing a shopping center in an opened position.
Figure 5A:
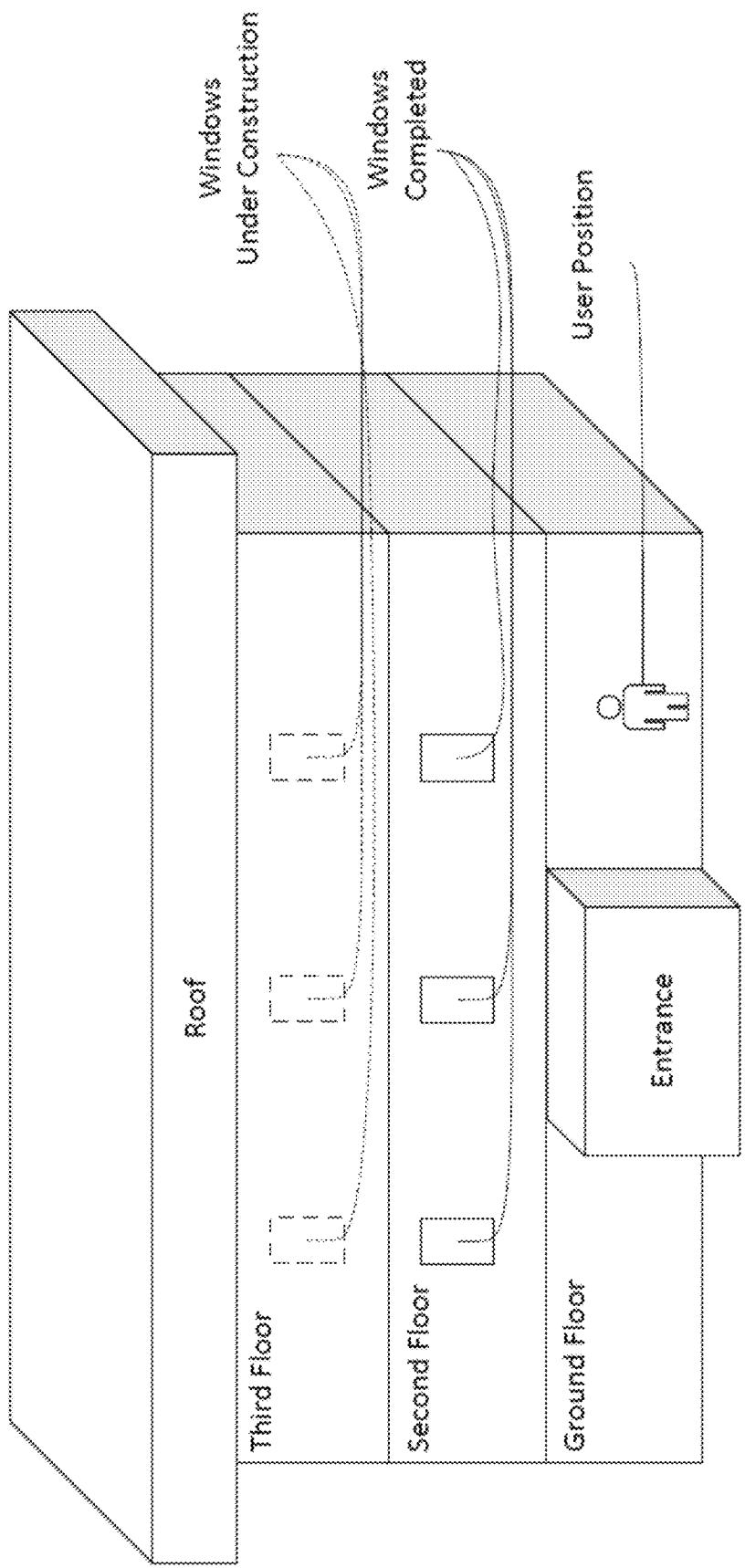
FIG. 5A is a diagram of a user interface showing a building under construction in a closed position.
Figure 5B:
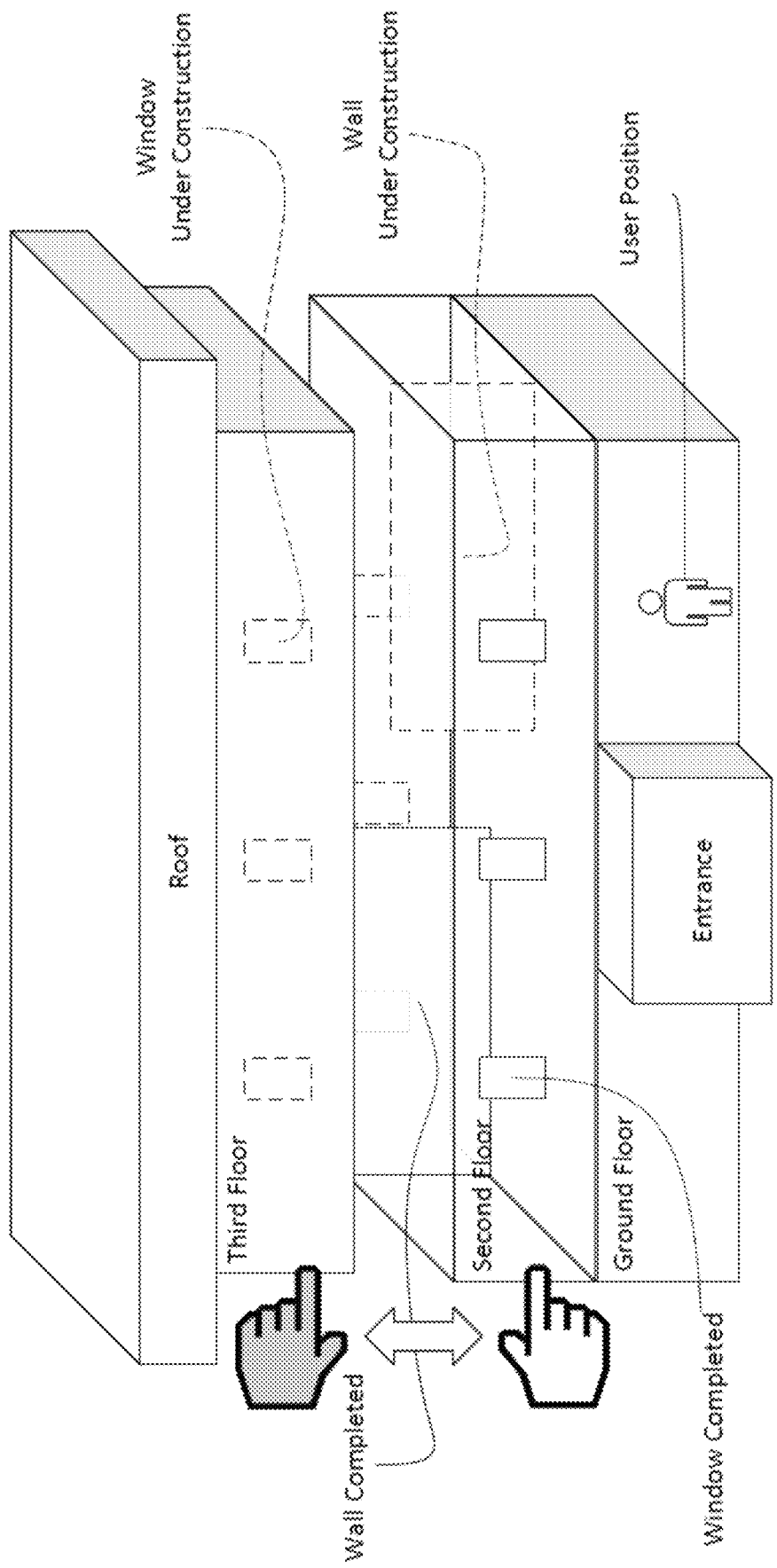
FIG. 5B is a diagram of a user interface showing a building under construction in a first opened position.
Figure 5C:
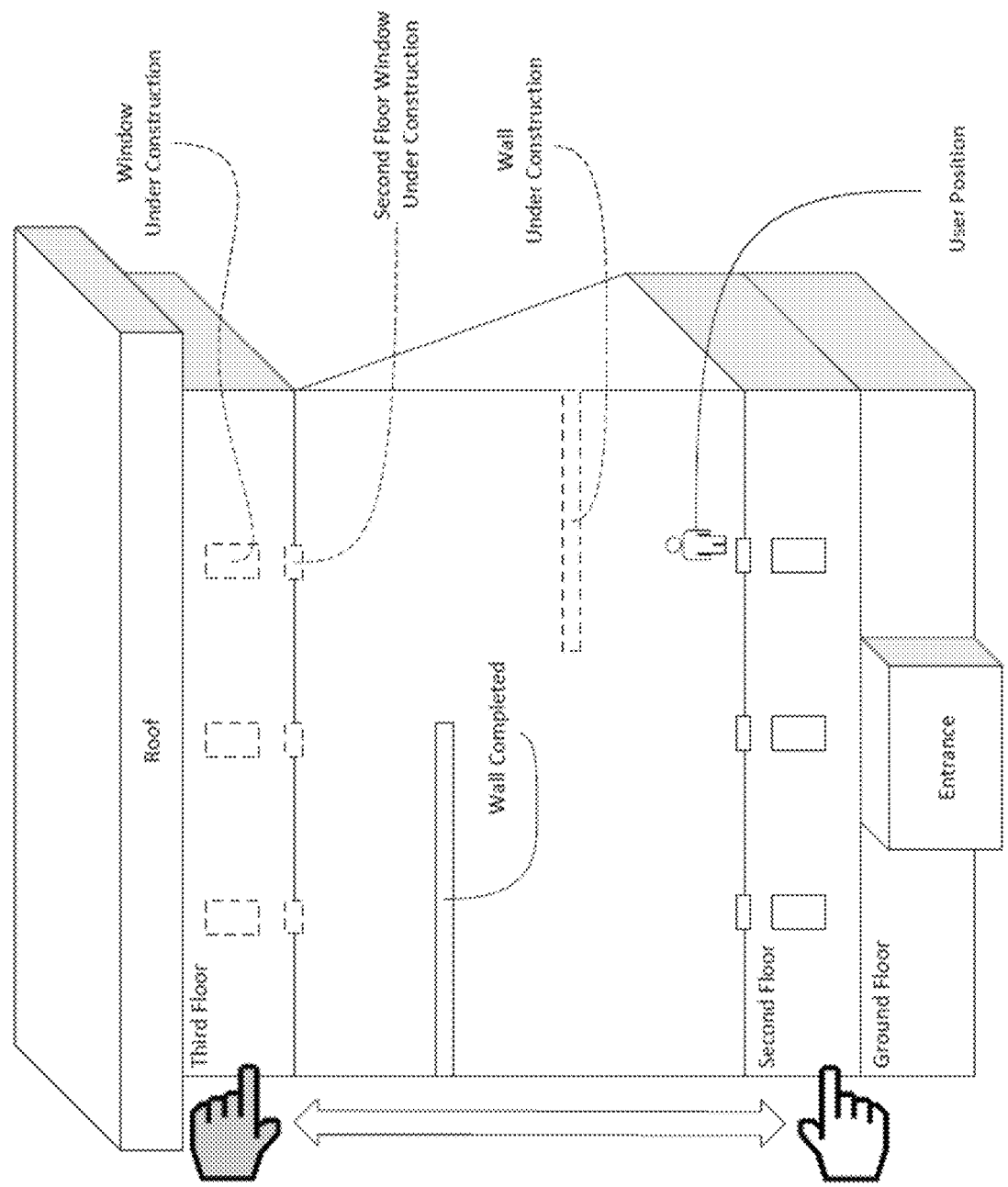
FIG. 5C is a diagram of a user interface showing a building under construction in a second opened position.
Figure 6A:
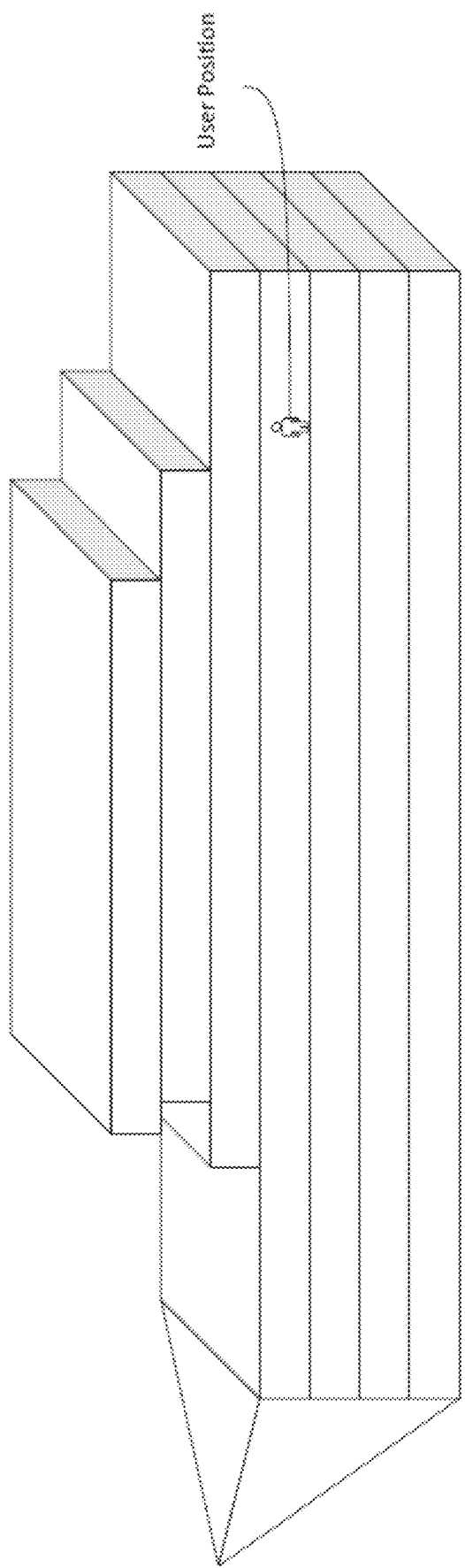
FIG. 6A is a diagram of a user interface showing a cruise ship in a closed position.
Figure 6B:
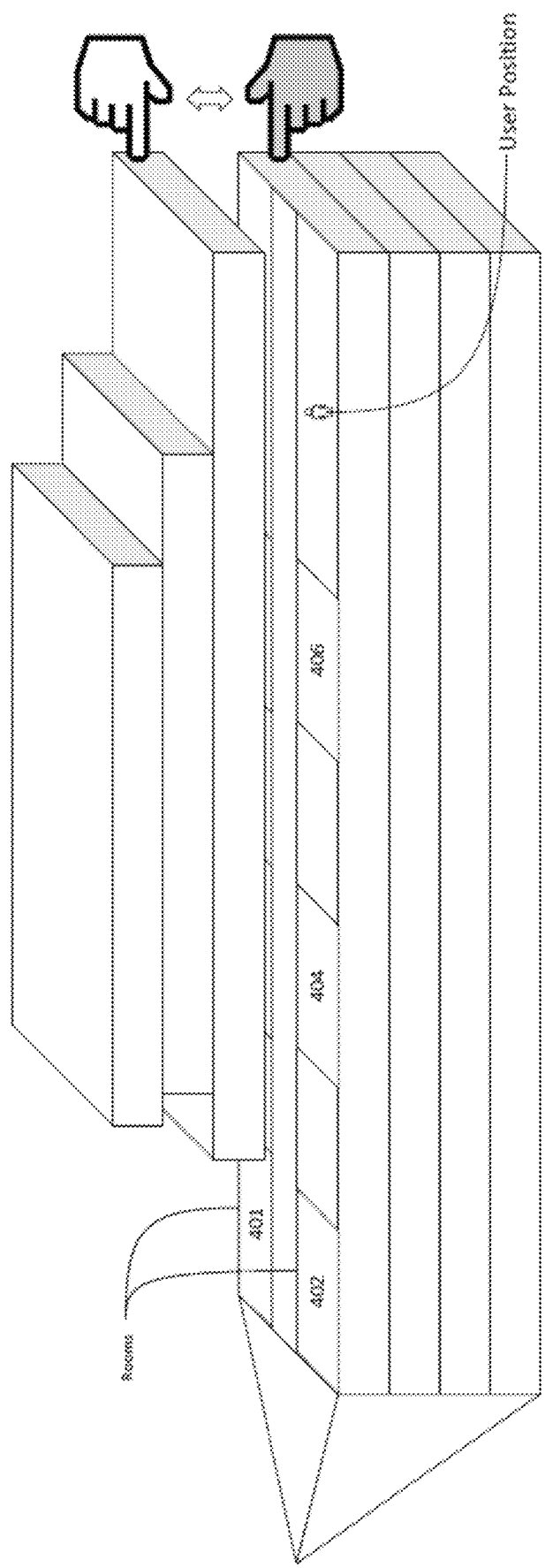
FIG. 6B is a diagram of a user interface showing a cruise ship in a first opened position.
Figure 6C:
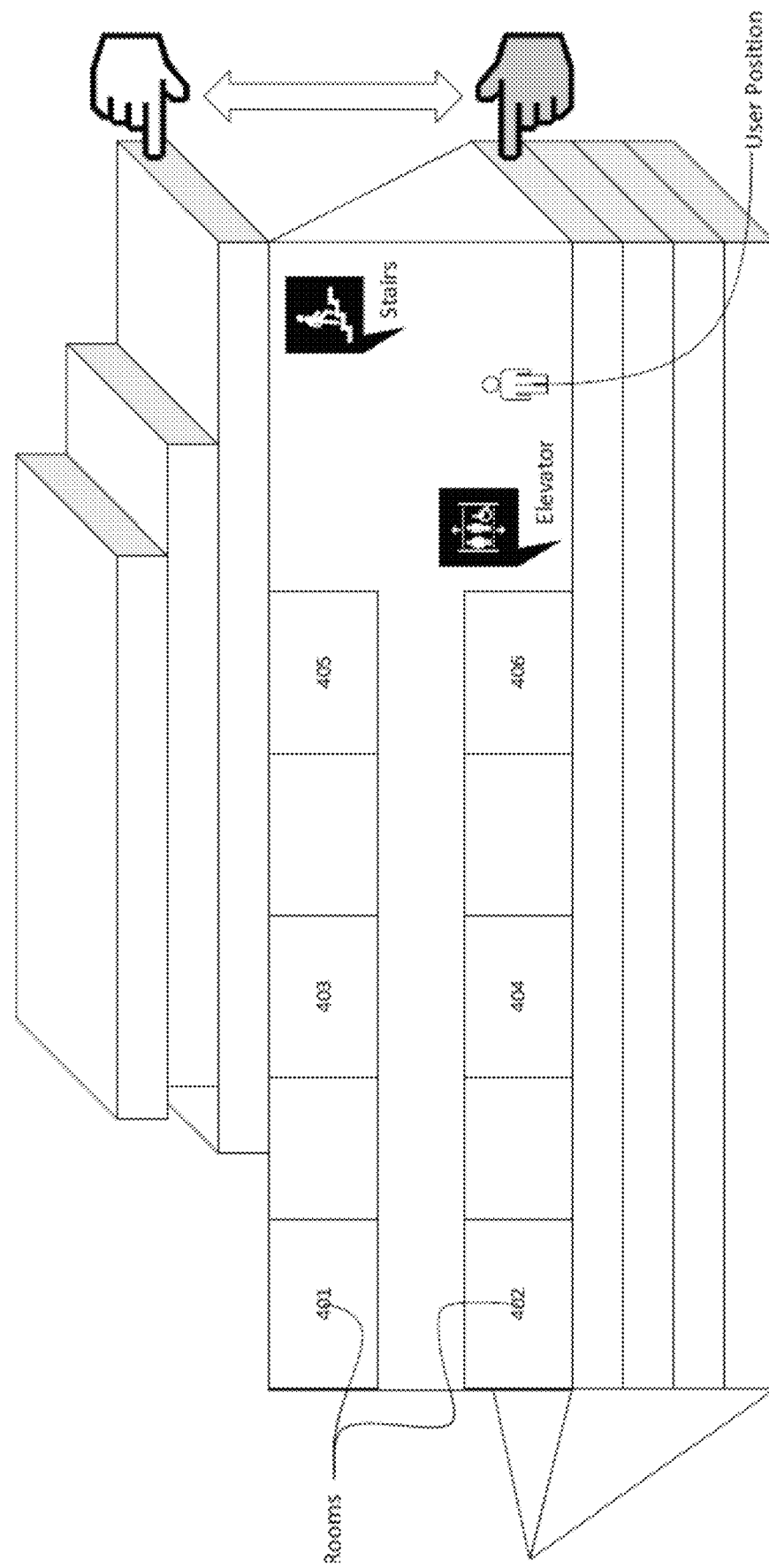
FIG. 6C is a diagram of a user interface showing a cruise ship in a second opened position. A plurality of rooms 401,402,403,404,405,406 are depicted.
Figure 7A:
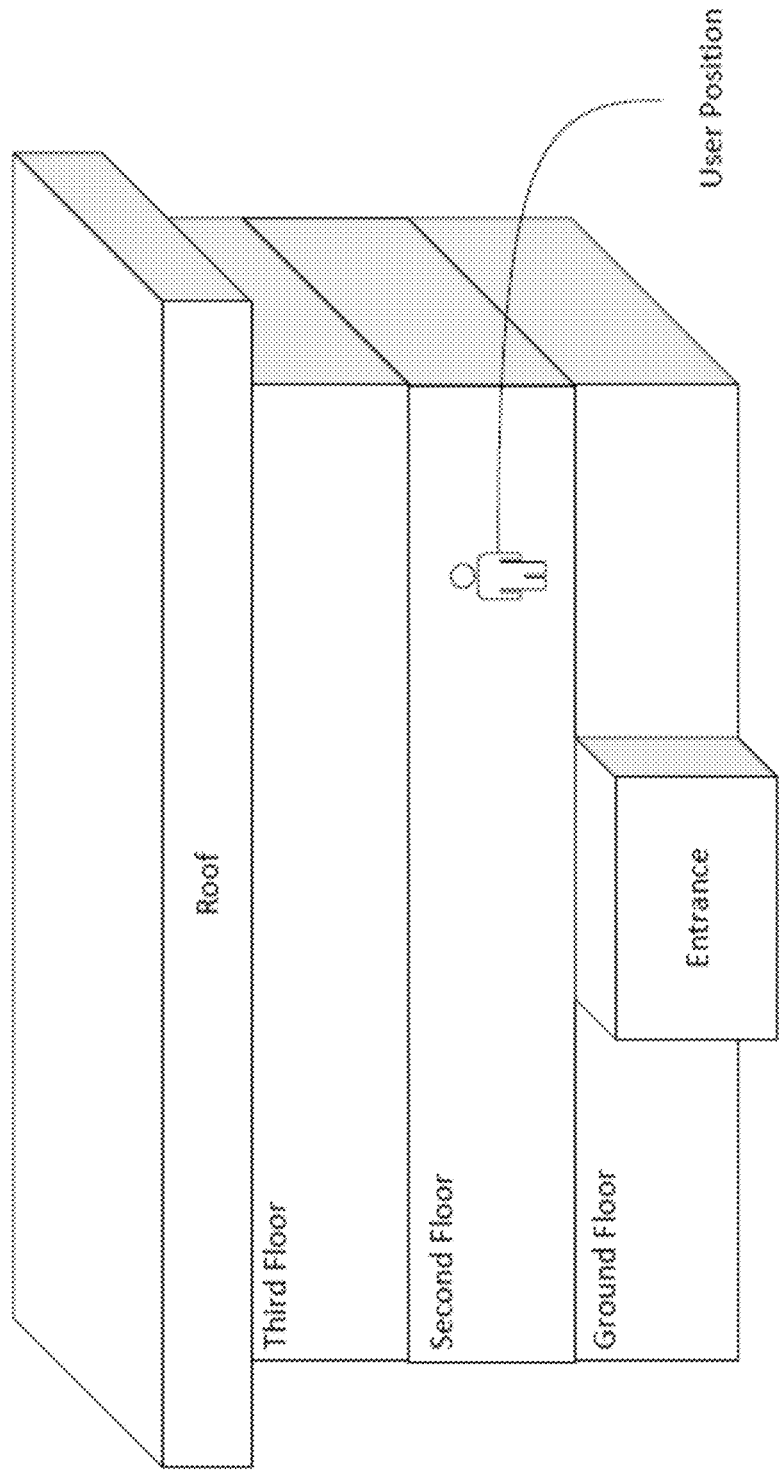
FIG. 7A is a diagram of a user interface showing a museum in a closed position.
Figure 7B:
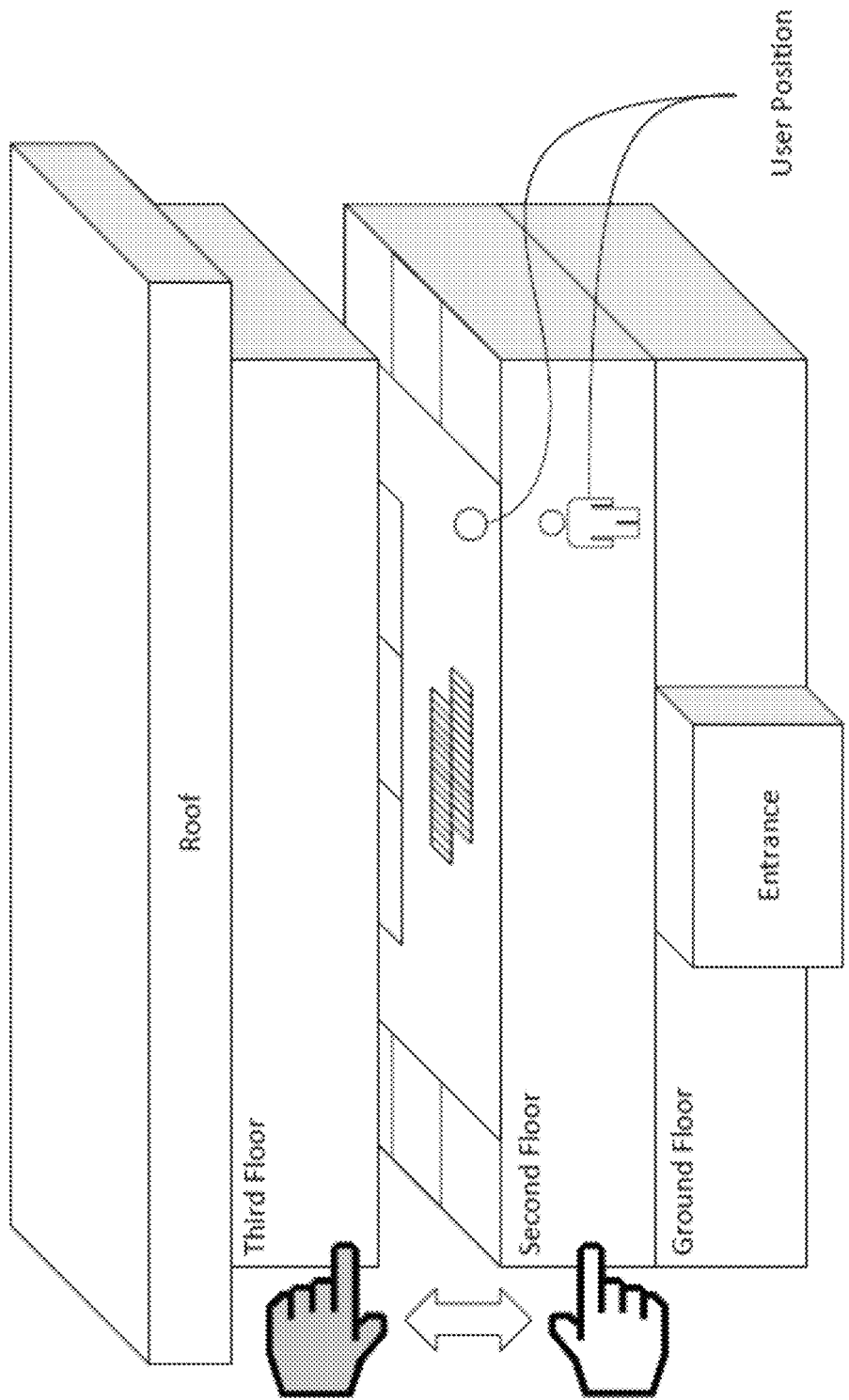
FIG. 7B is a diagram of a user interface showing a museum in a first opened position.
Figure 7C:
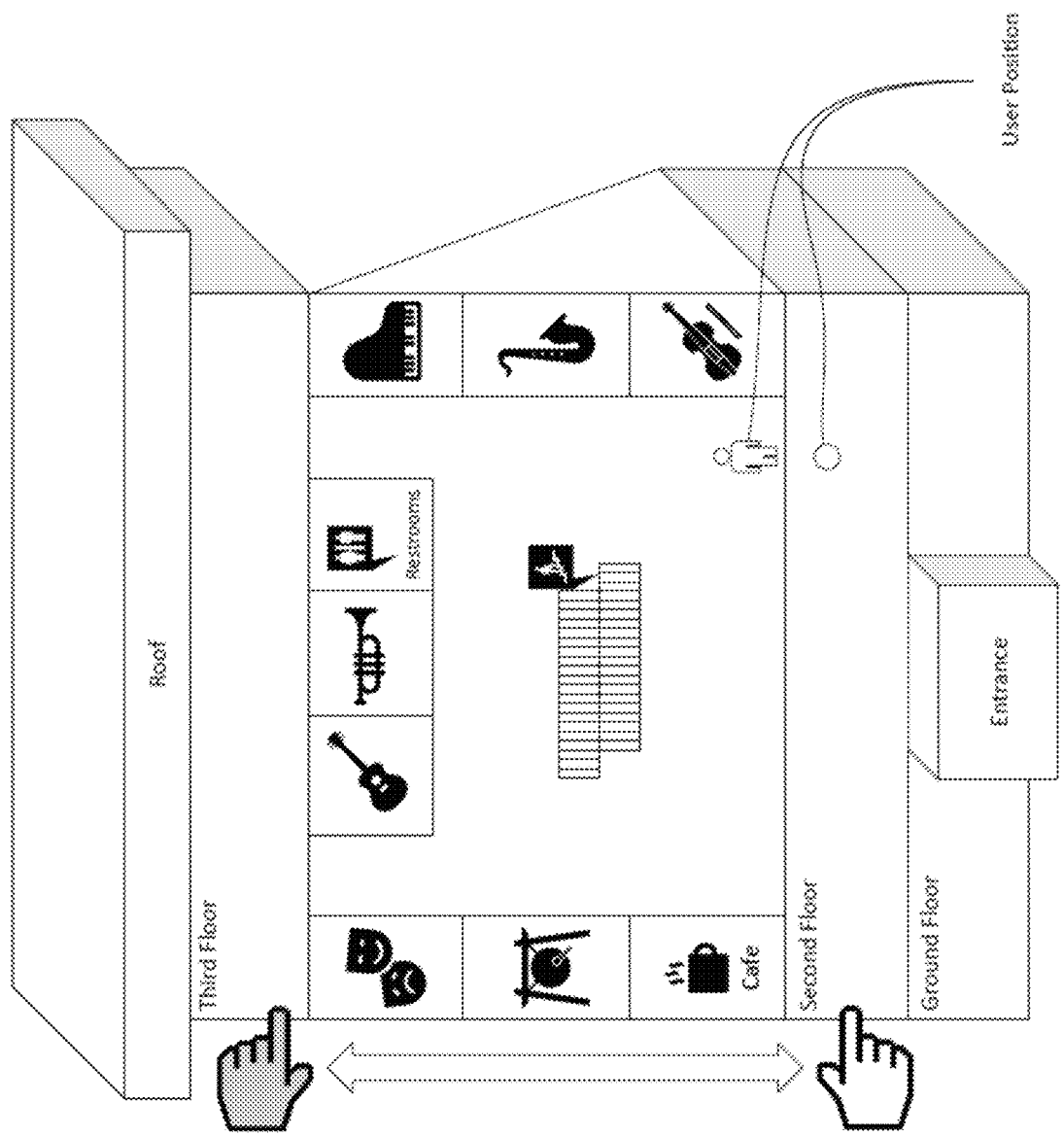
FIG. 7C is a diagram of a user interface showing a museum p in a second opened position.
Figure 8A:
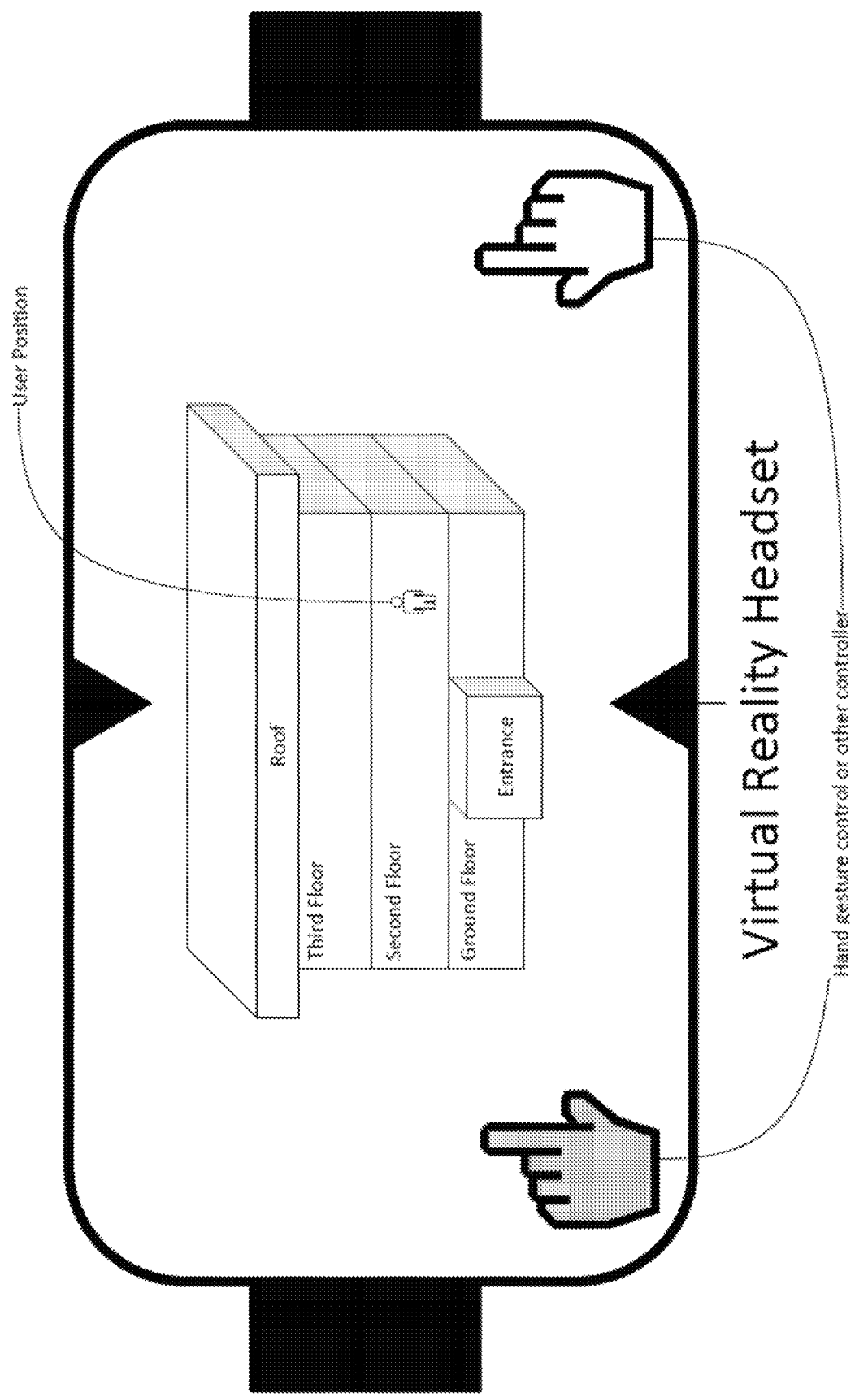
FIG. 8A is a diagram of a user interface displayed on a virtual reality headset, with the object in a closed position.
Figure 8B:
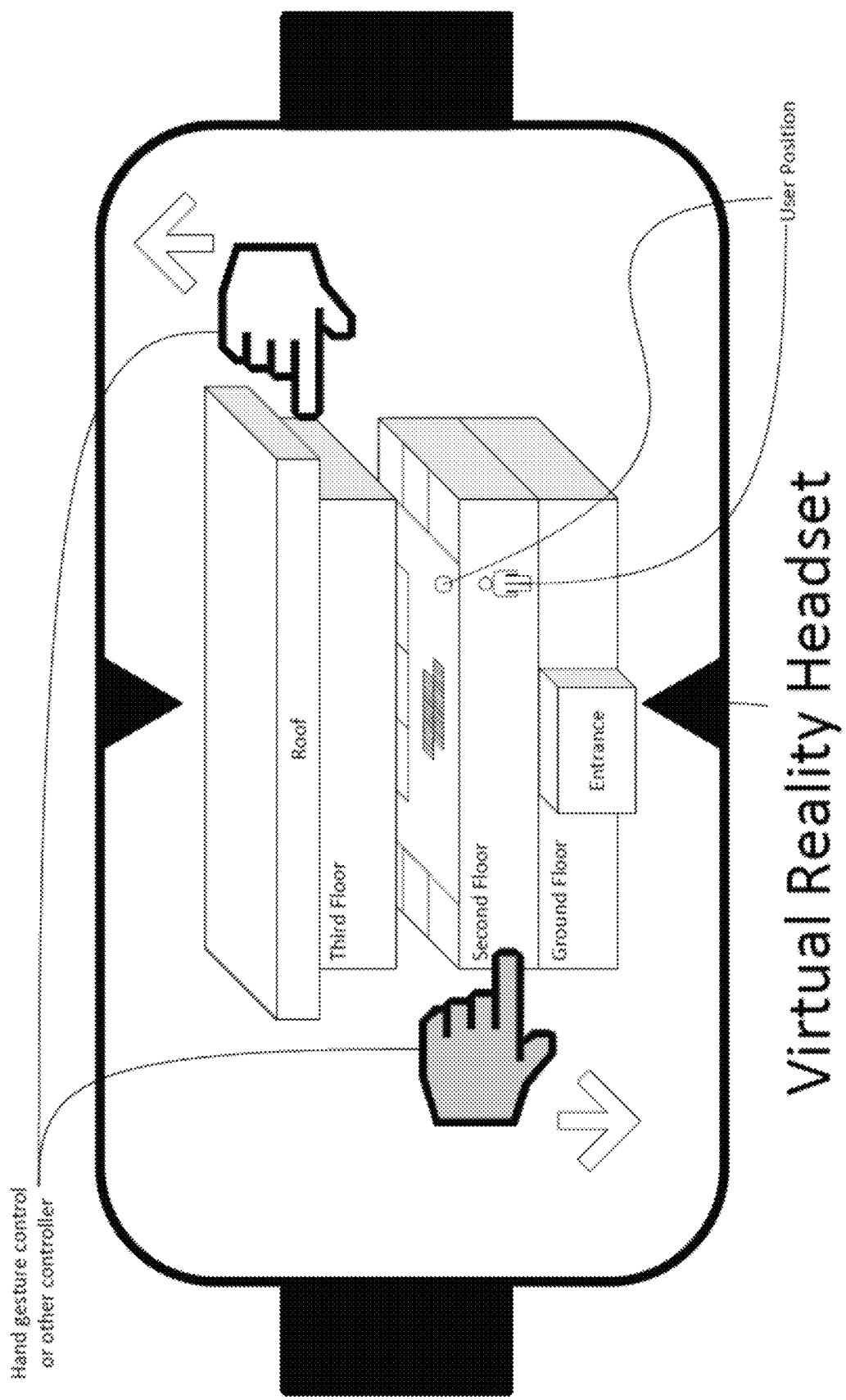
FIG. 8B is a diagram of a user interface displayed on a virtual reality headset, with the object in a first opened position.
Figure 8C:
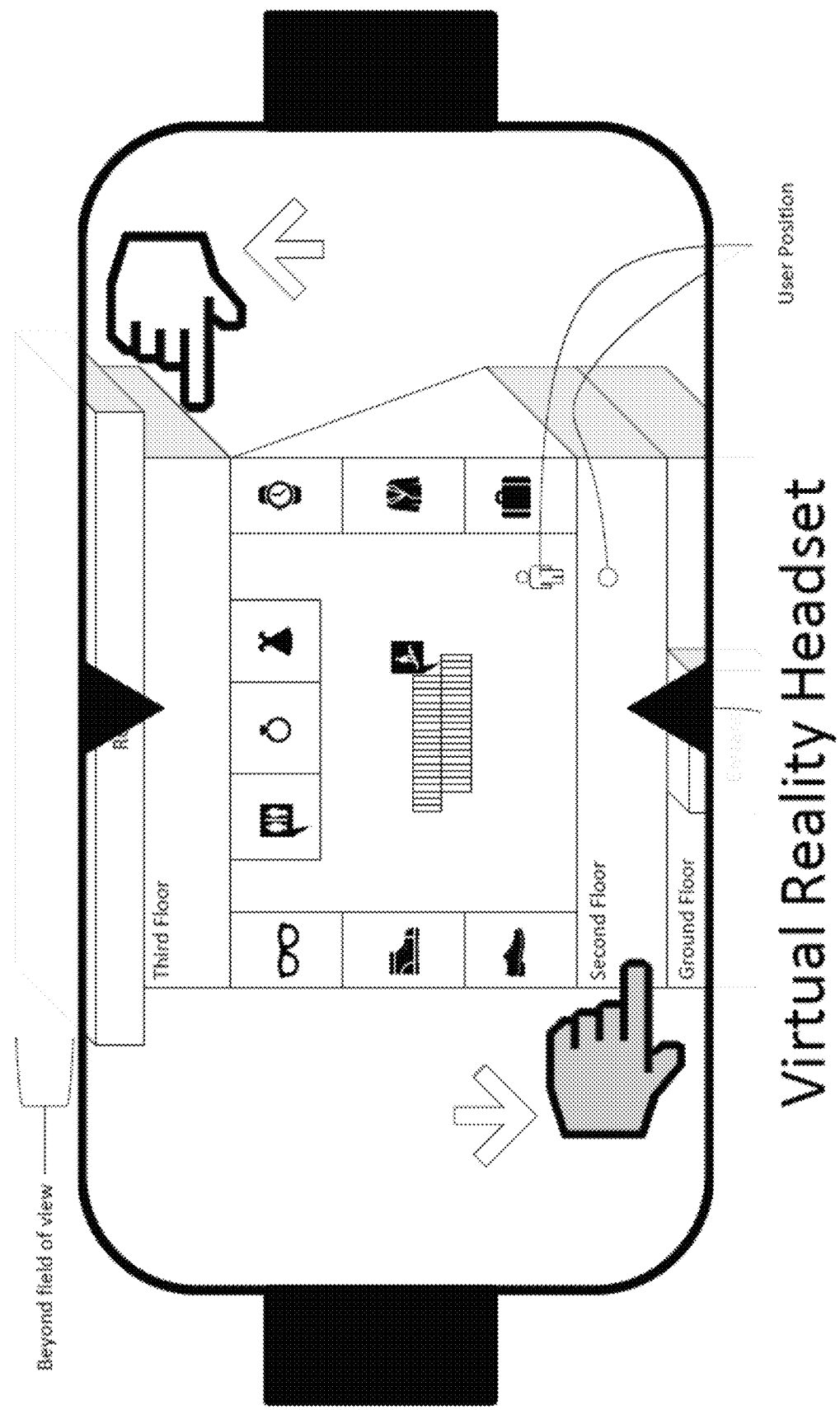
FIG. 8C is a diagram of a user interface displayed on a virtual reality headset, with the object in a second opened position.
Figure 9A:
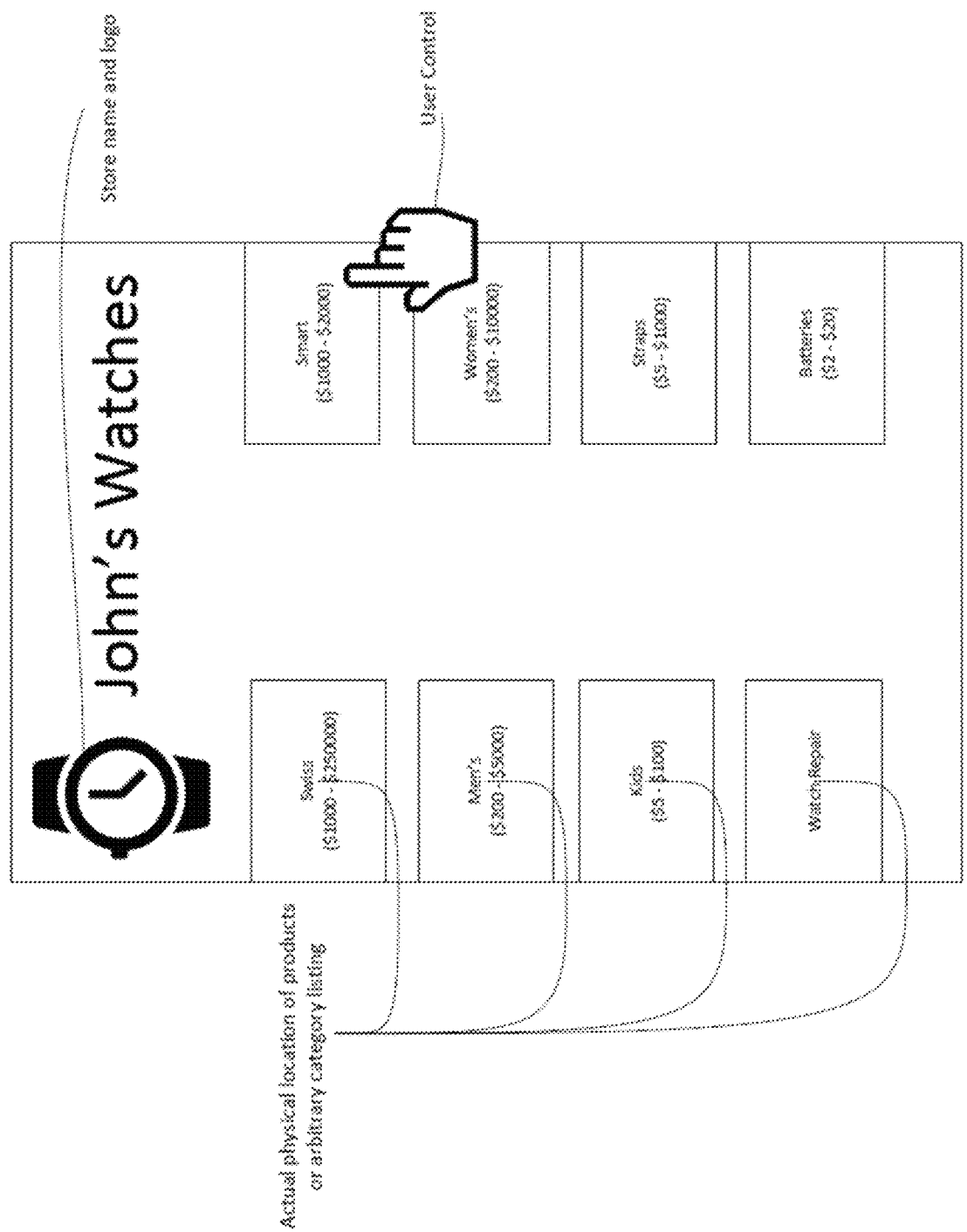
FIG. 9A is a diagram of a user interface showing an individual store of a shopping center with information on products and pricing.
Figure 9B:
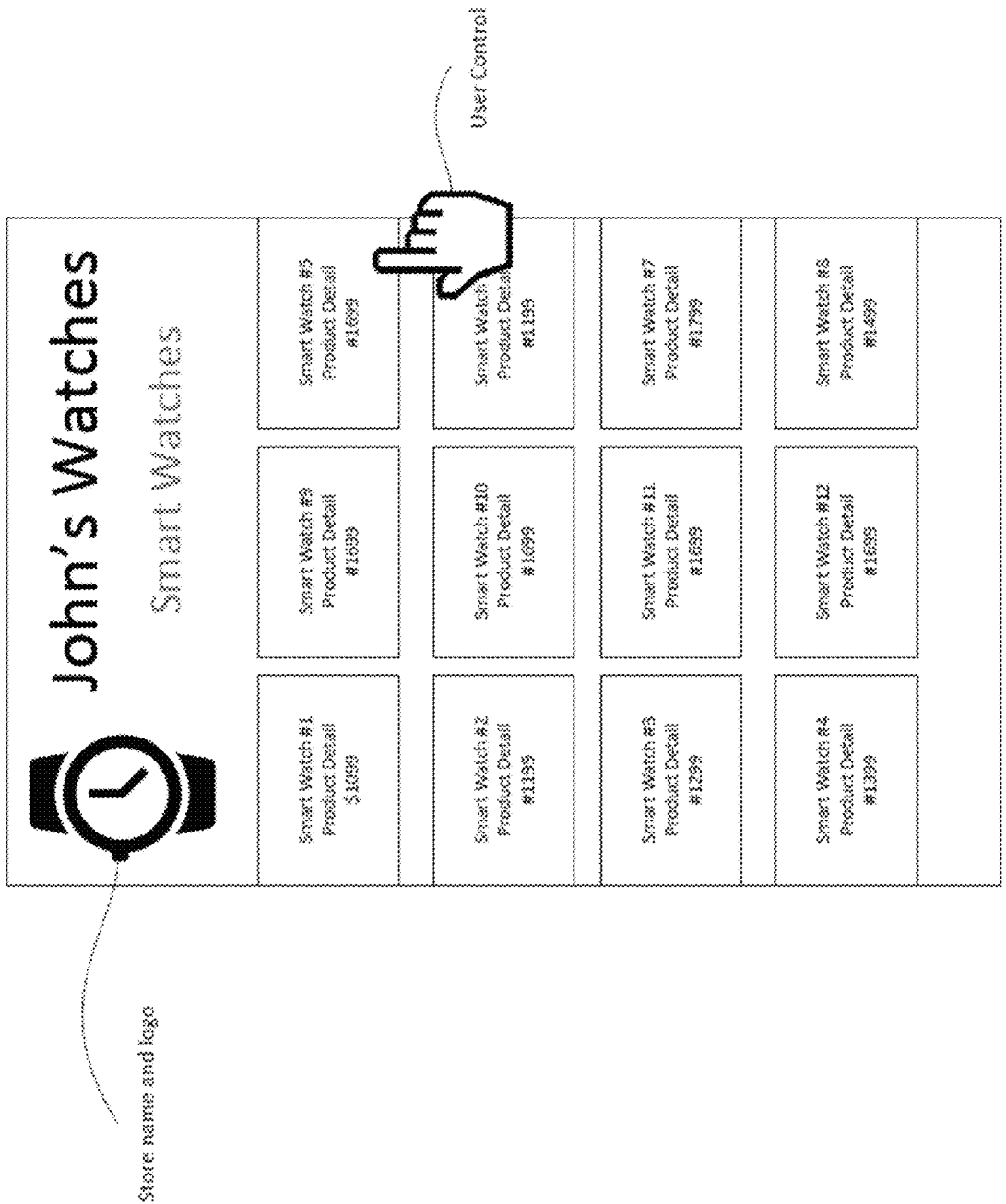
FIG. 9B is a diagram of a user interface showing an individual store of a shopping center with information on products and pricing.
Figure 10A:
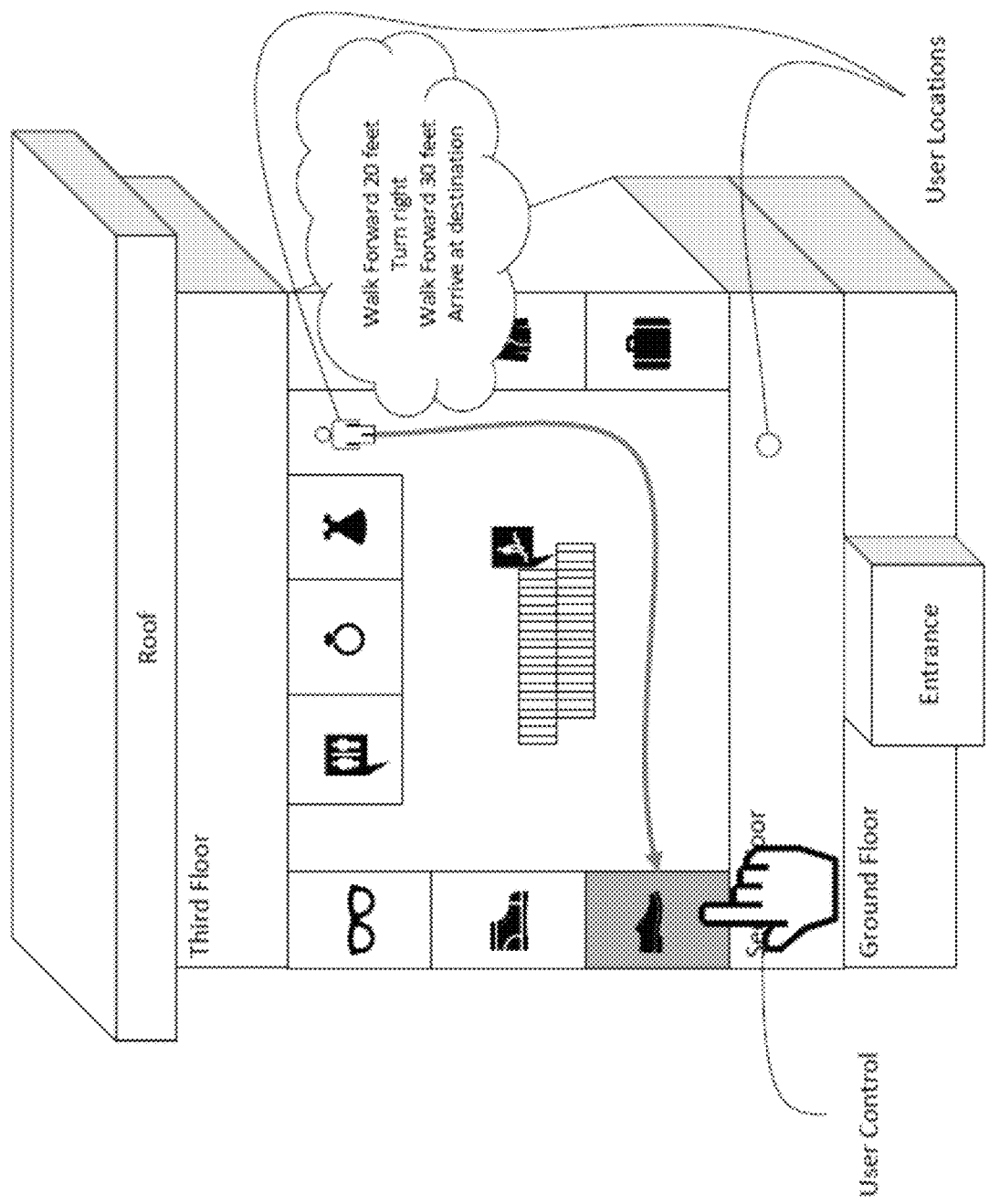
FIG. 10A is a diagram of a user interface showing a shopping center in an opened position with user instructions for reaching a selected destination.
Figure 10B:
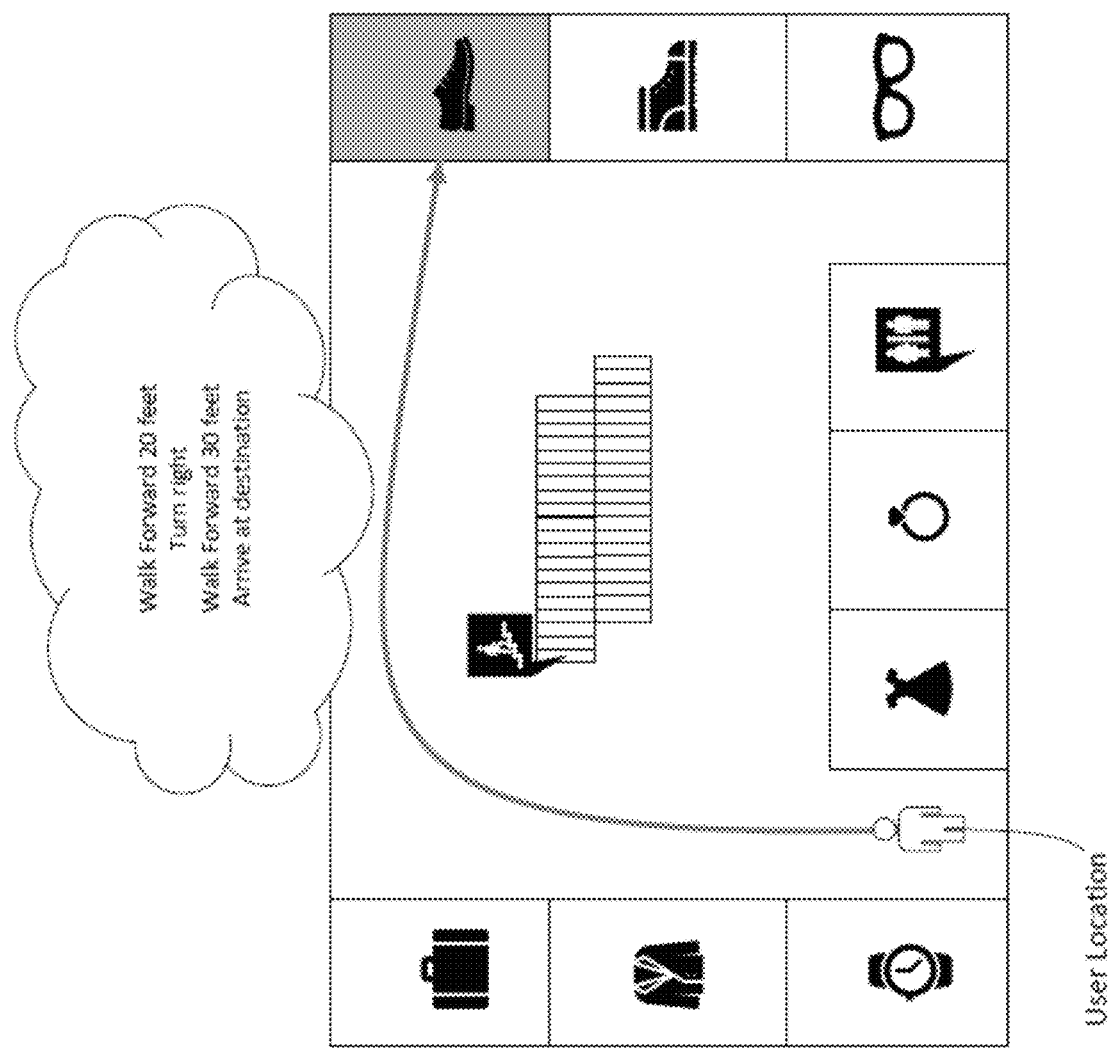
FIG. 10B is a diagram of a user interface showing a shopping center in an opened position with user instructions for reaching a selected destination
Figure 11:
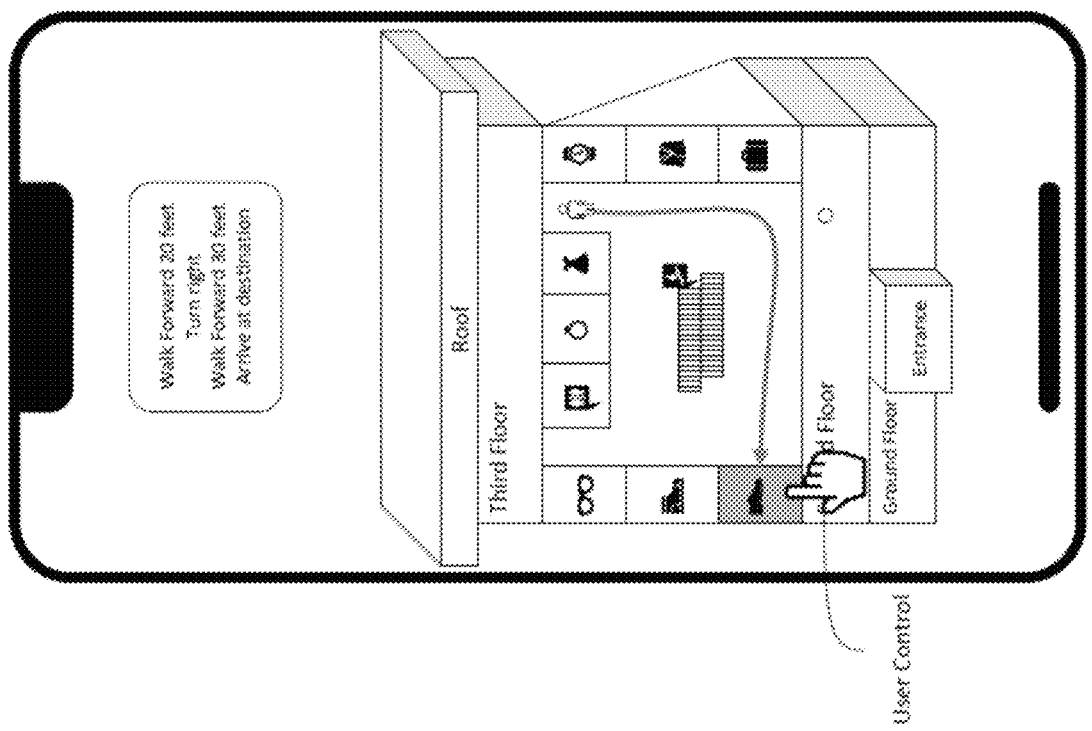
FIG. 11 is a diagram of a user interface displayed on a personal electronic device.
Figure 12:
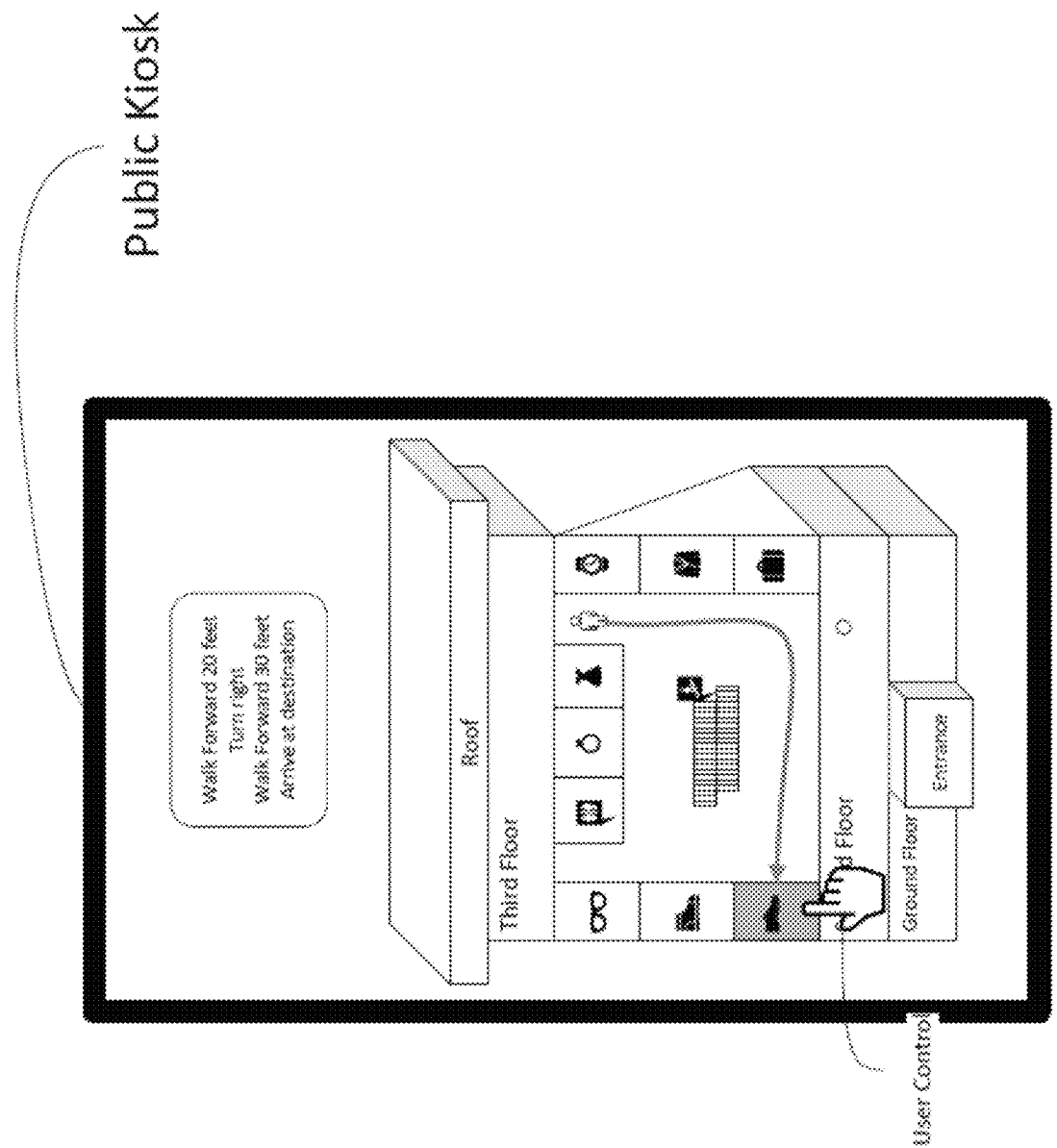
FIG. 12 is a diagram of a user interface displayed on a public kiosk.
Figure 13:
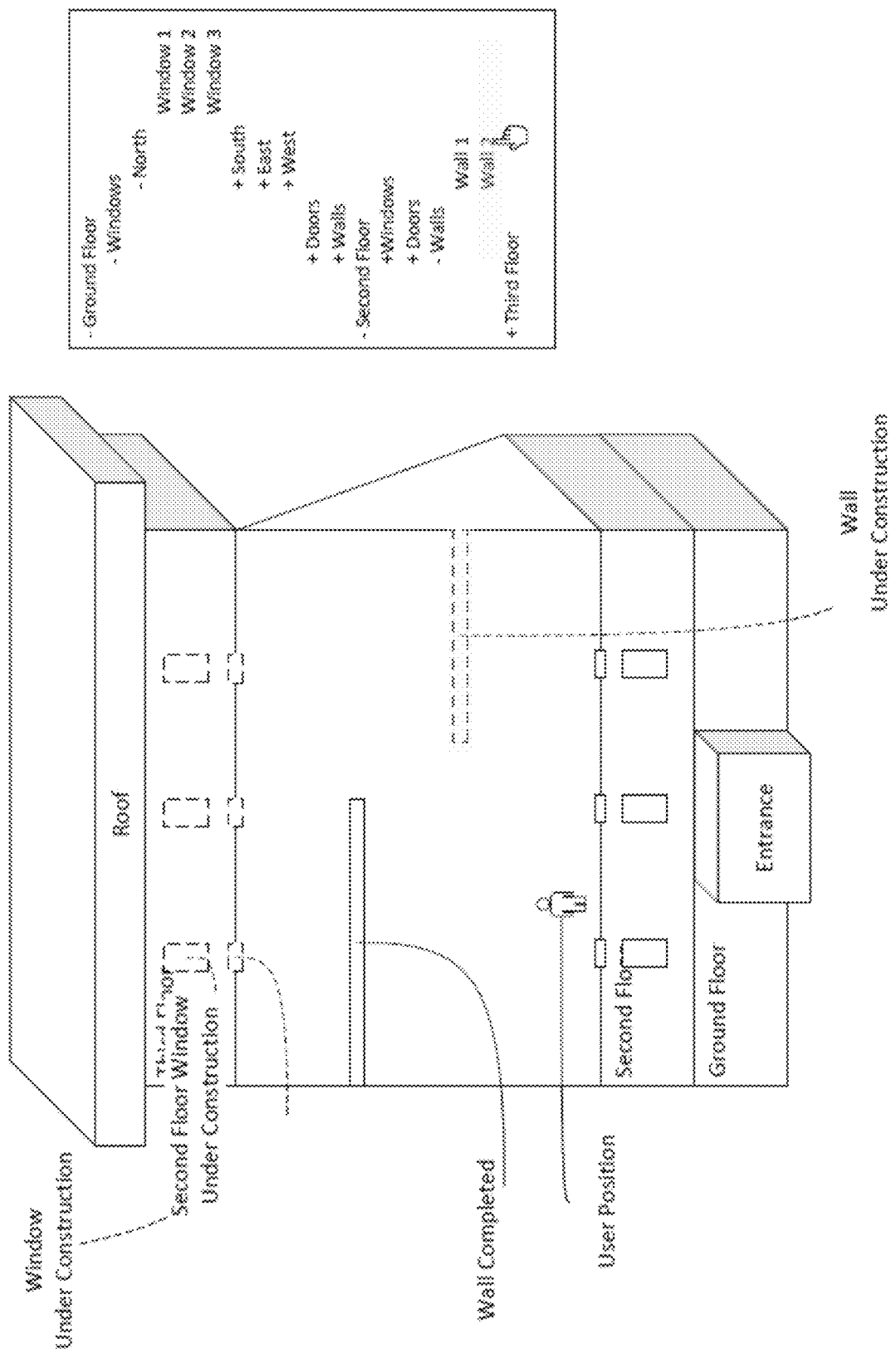
FIG. 13 is a diagram of a user interface showing a building under construction in an opened position, where elements can be selected by using a remote icon from a categorized list that is adjacent to the structure on the user interface.
Figure 14A:
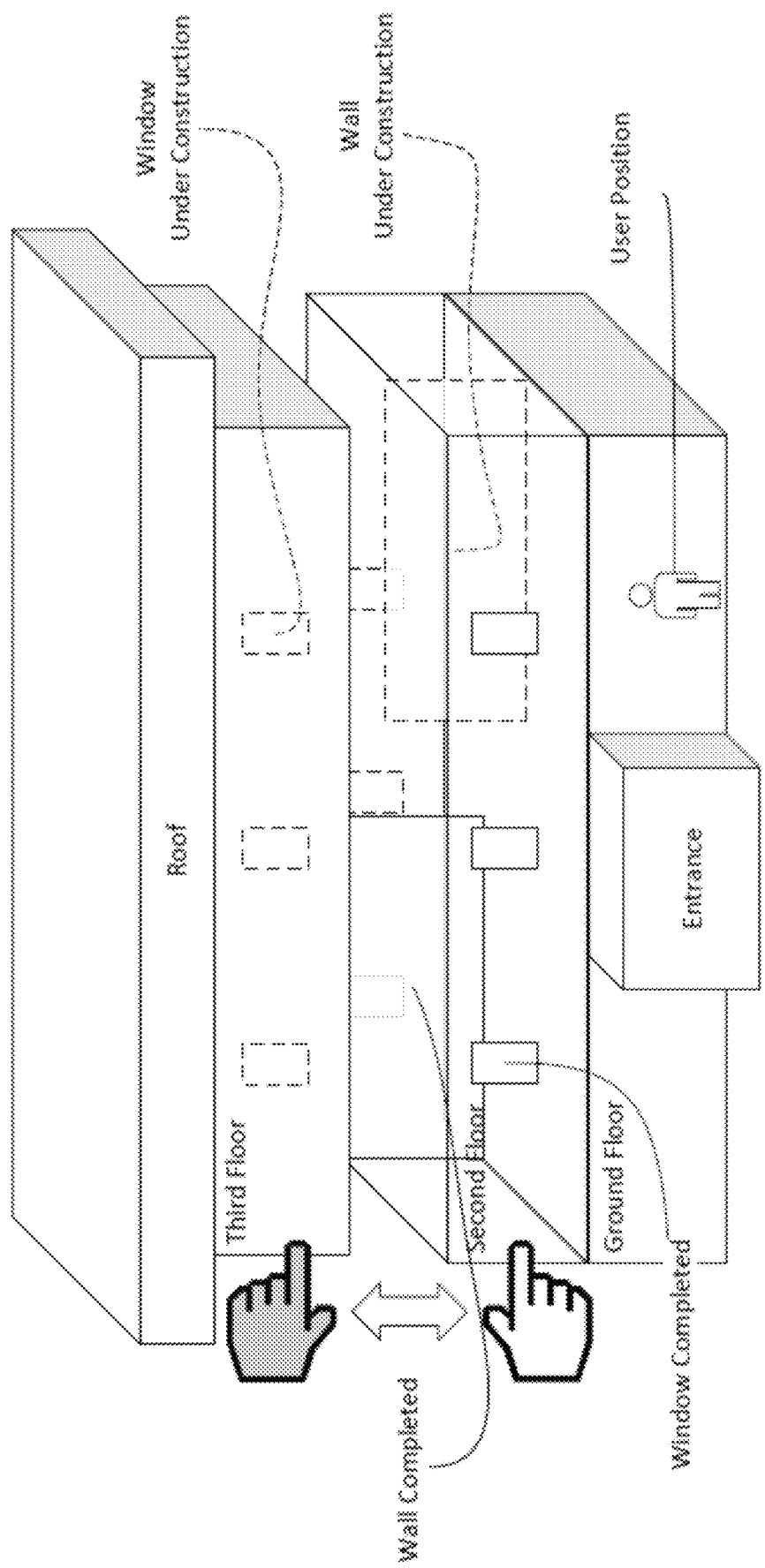
FIG. 14A is a diagram of a user interface showing elements of a building under construction being separated using finger gestures.
Figure 14B:
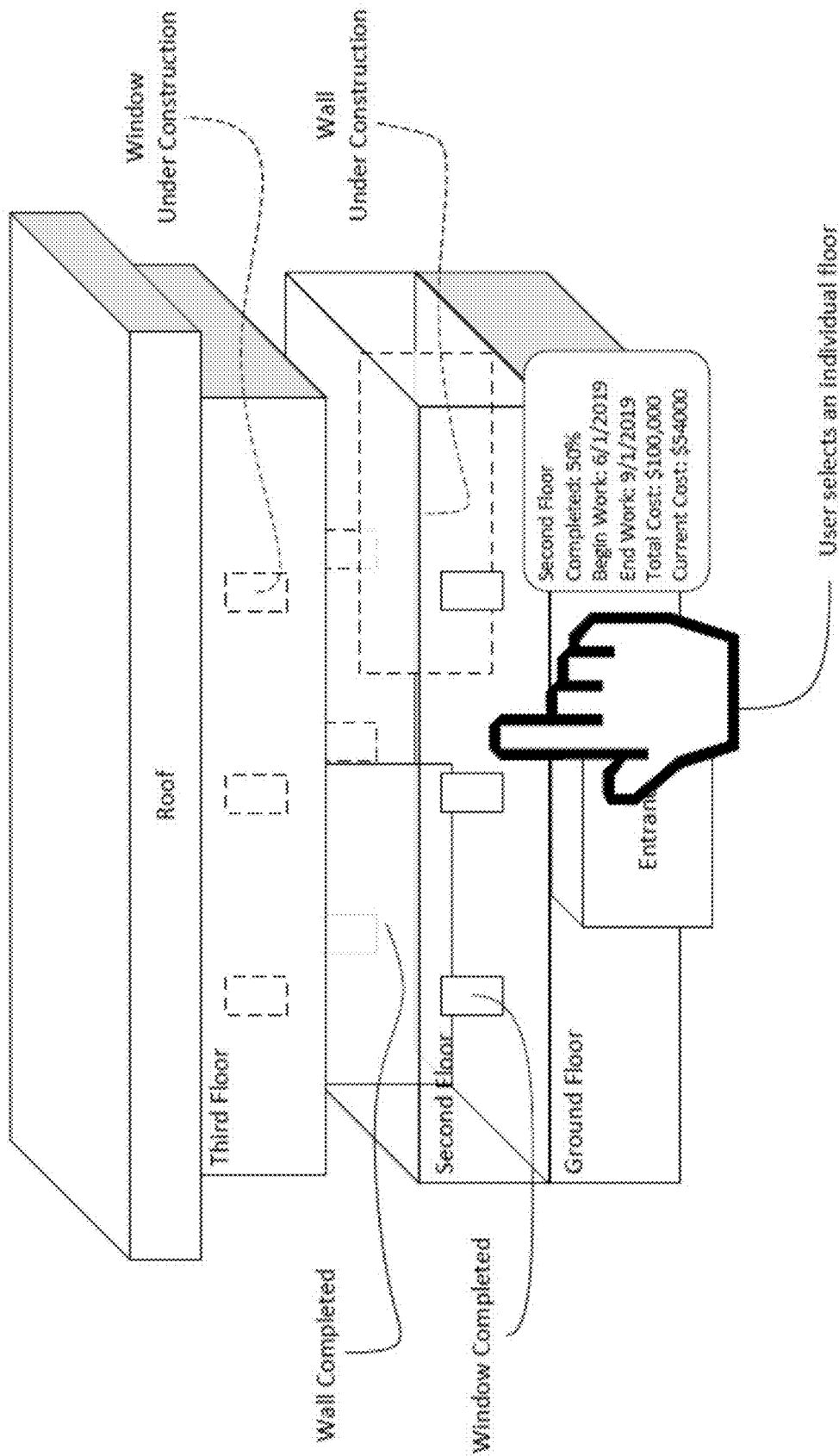
FIG. 14B is a diagram of a user interface showing a building under construction in an opened position, where individual floors can be seen.
Figure 14C:
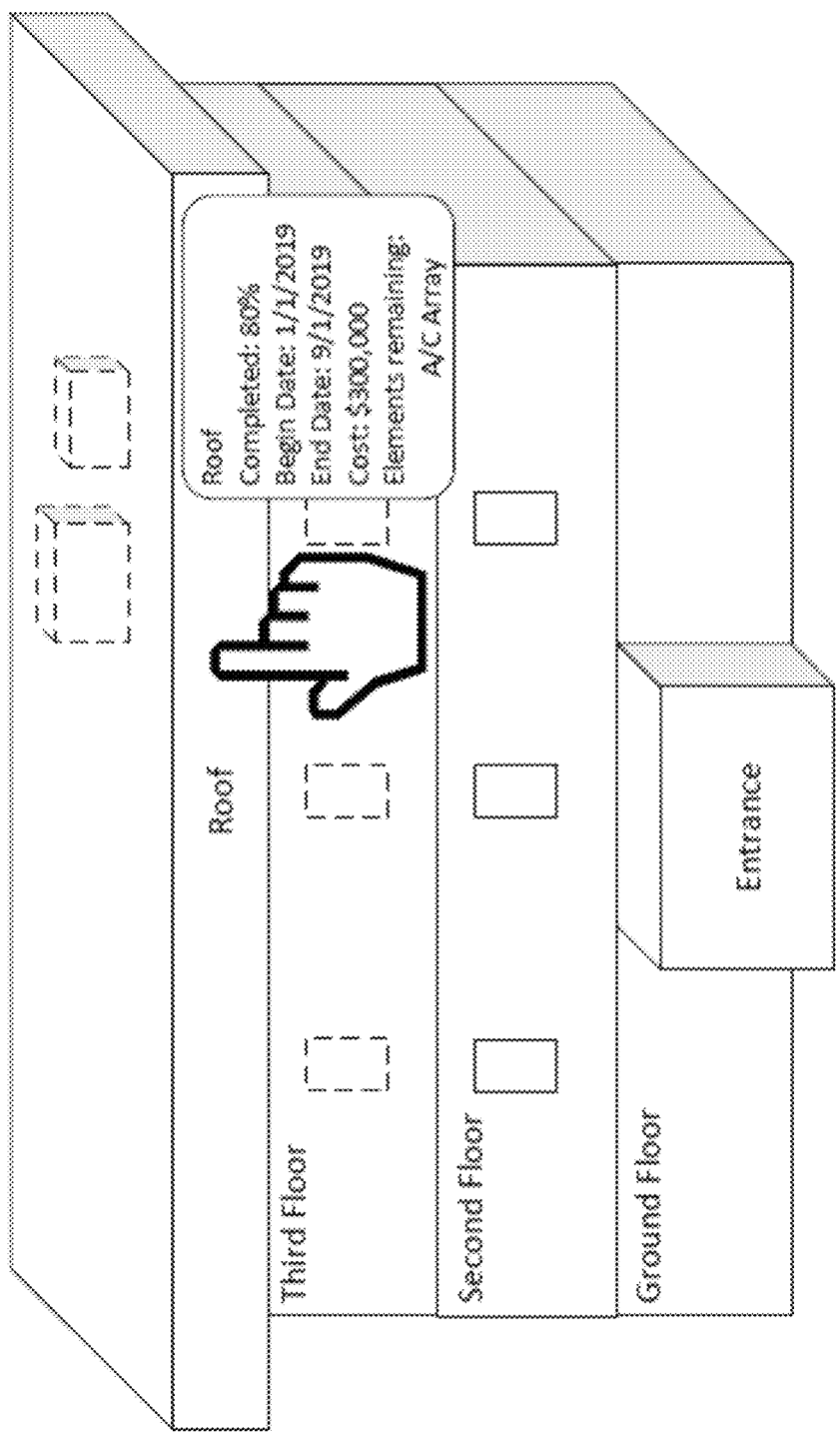
FIG. 14C is a diagram of a user interface showing a building under construction in an opened position, where a roof can be seen.
Figure 14D:
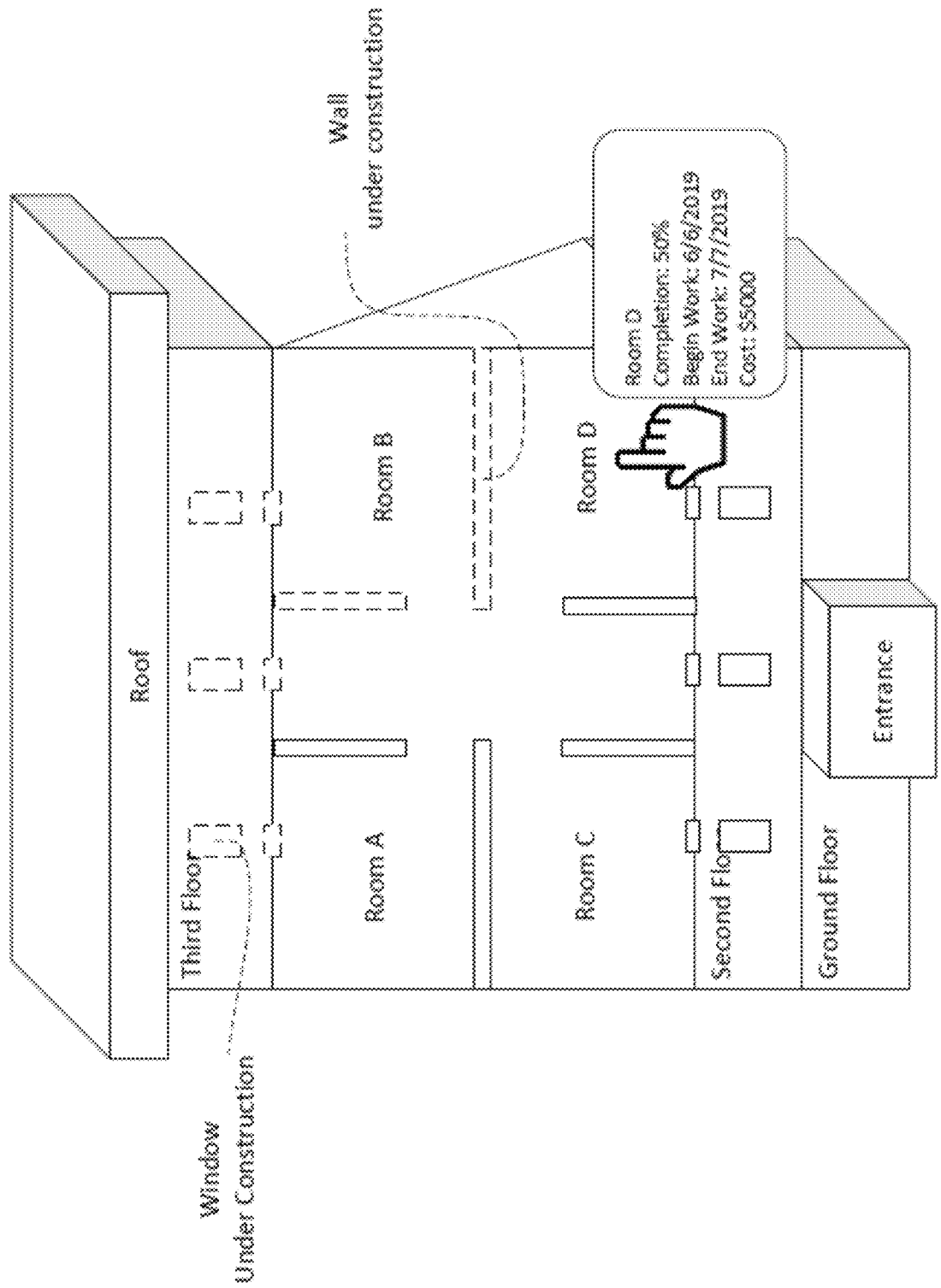
FIG. 14D is a diagram of a user interface showing a building under construction in an opened position, where individual rooms can be seen.
Figure 15:
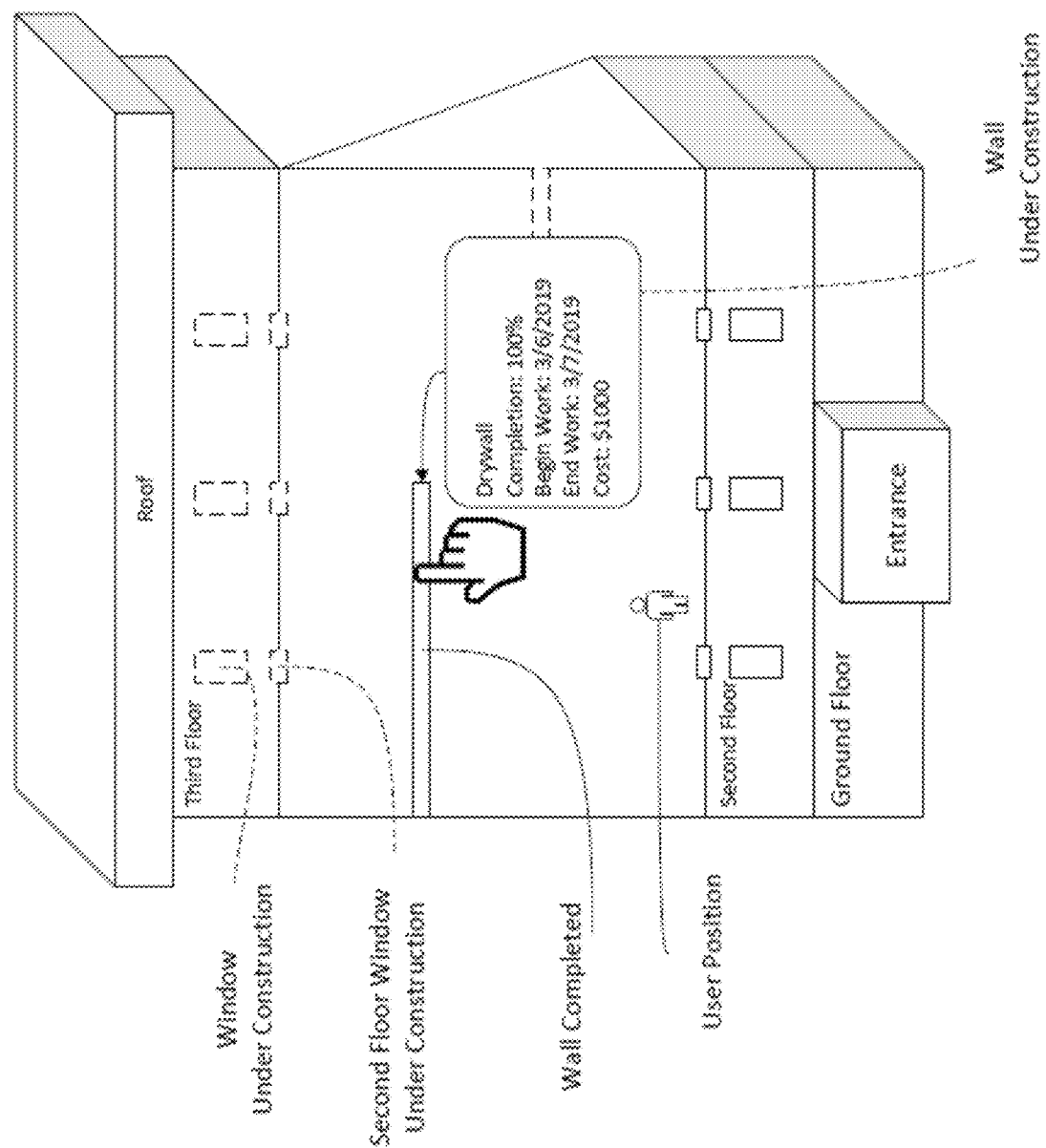
FIG. 15 is a diagram of a user interface showing a building under construction in an opened position, where information including percent completion, start of work date, end of work date, and cost is displayed.
Figure 16:
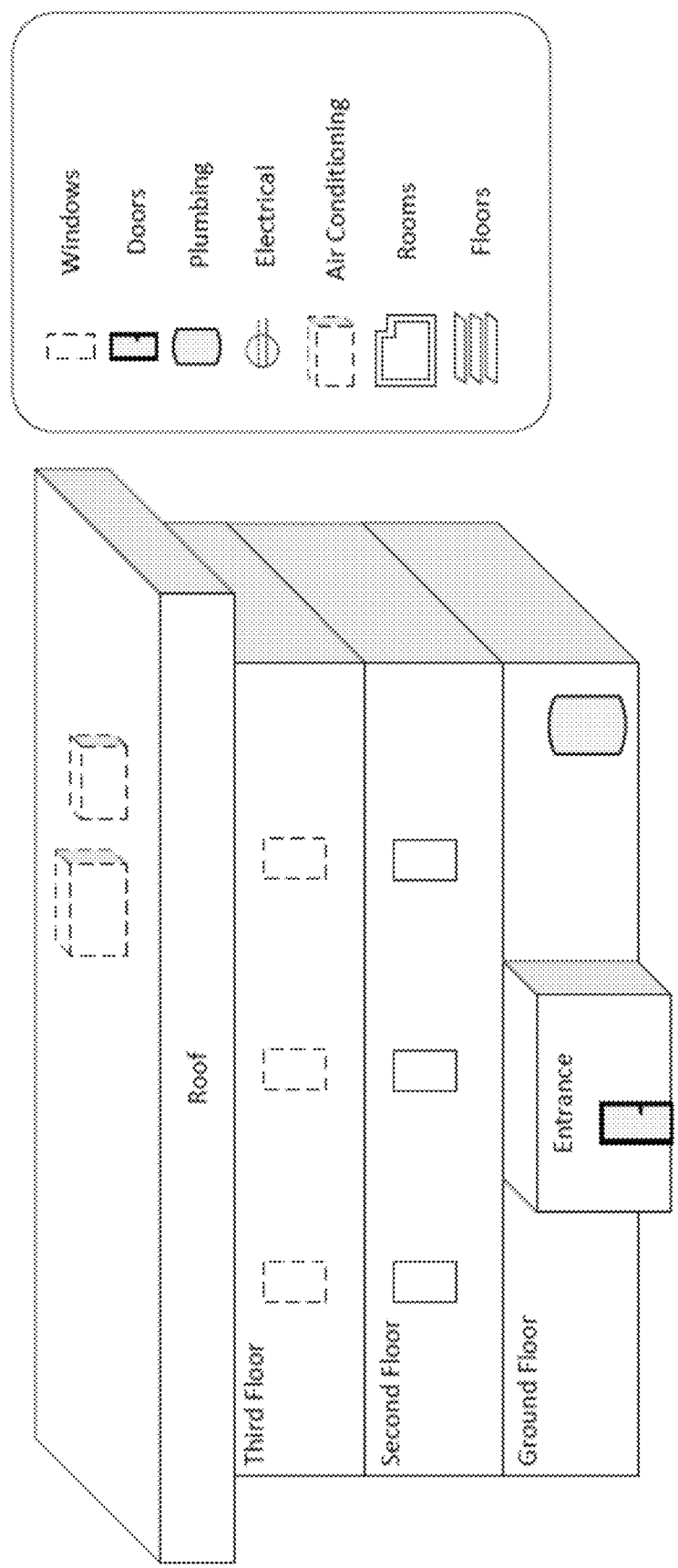
FIG. 16 is a diagram of a user interface showing a building under construction in a closed position, where a legend is provided adjacent to the structure.
Figure 17A:
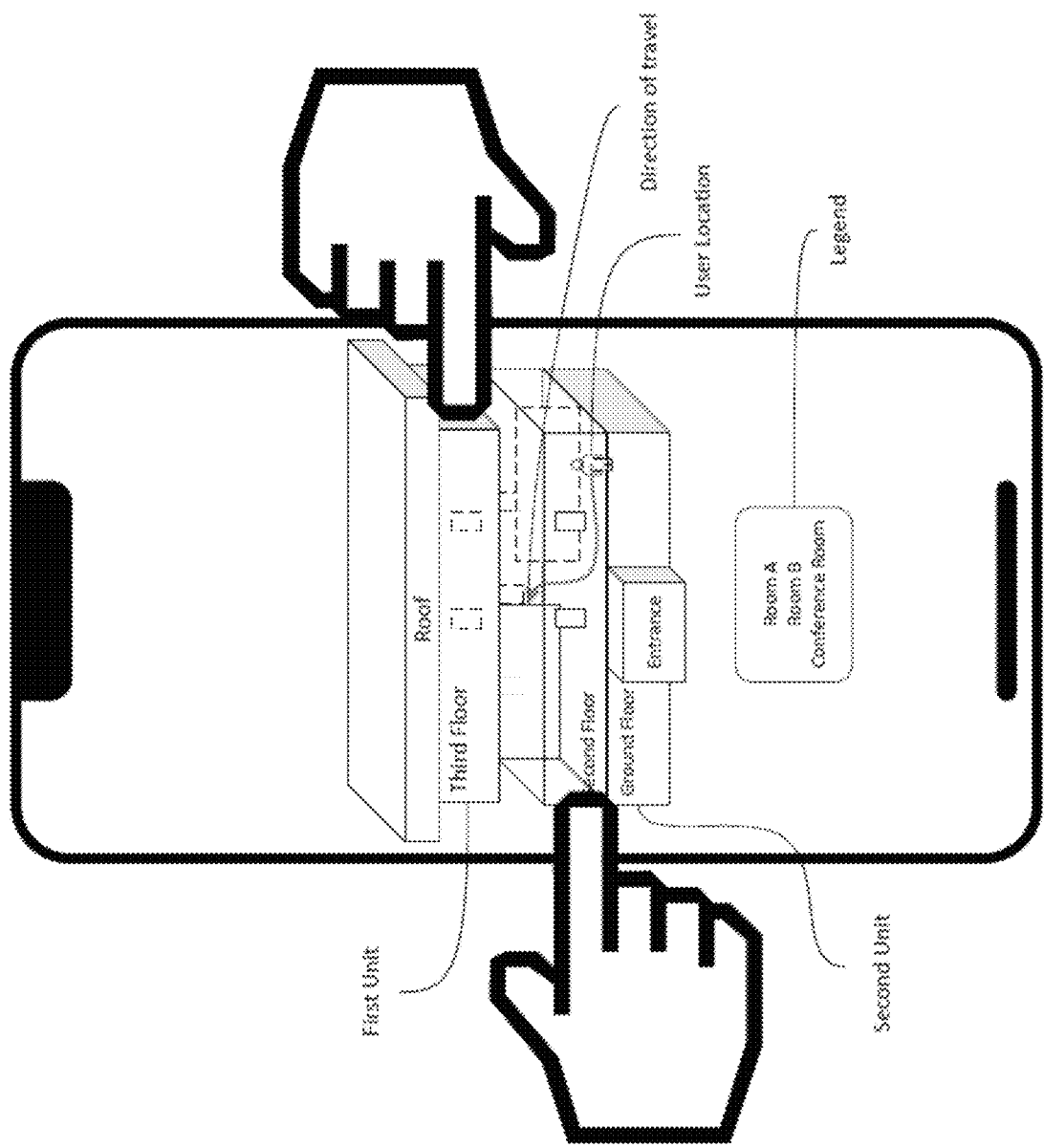
FIG. 17A is a diagram of a user interface displayed on a personal electronic device, showing a building in an opened position, where finger gestures are used to separate floors. A legend, user location, and direction of travel can be seen.
Figure 17B:
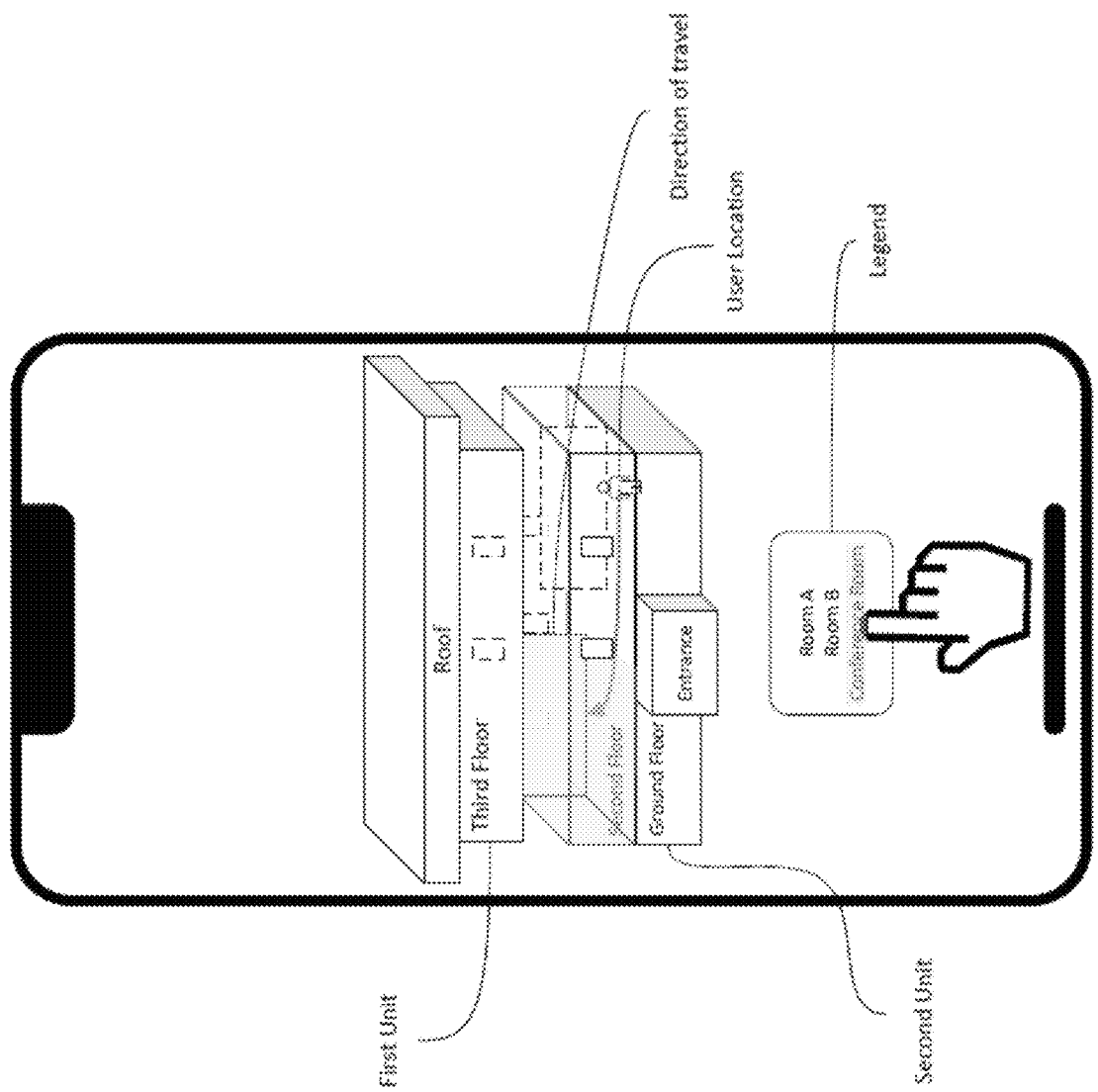
FIG. 17B is a diagram of a user interface displayed on a personal electronic device, showing a building in an opened position, where an item has been selected from the legend and highlighted on the structure. A user location and direction of travel can be seen.

FIG. 3 shows a block diagram illustrating components of a computing device or system used in some implementations of techniques and systems for of the present invention. For example, a user interface of the subject invention can be included within and supported by the device 1000. The device 1000 can itself include one or more computing devices. The hardware can be configured according to any suitable computer architectures such as Symmetric Multi- Processing (SMP) architecture or Non-Uniform Memory Access (NUMA) architecture.

The device 1000 can include a processing system 1001, which may include a processing device such as a central processing unit (CPU) or microprocessor and other circuitry that retrieves and executes software 1002 from storage system 1003. Processing system 1001 may be implemented within a single processing device but may also be distributed across multiple processing devices or sub-systems that cooperate in executing program instructions. The device 1000 may have a wireless or wired interface 1005 for internet connectivity or to be programmed and controlled.

Examples of processing system 1001 include general purpose central processing units, application specific processors, and logic devices, as well as any other type of processing device, combinations, or variations thereof. The one or more processing devices may include multiprocessors or multi-core processors and may operate according to one or more suitable instruction sets including, but not limited to, a Reduced Instruction Set Computing (RISC) instruction set, a Complex Instruction Set Computing (CISC) instruction set, or a combination thereof. In certain embodiments, one or more digital signal processors (DSPs) may be included as part of the computer hardware of the system in place of or in addition to a general purpose CPU.

Storage system 1003 may comprise any computer readable storage media readable by processing system 1001 and capable of storing software 1002 including, e.g., processing instructions for the methods of the present invention. The storage system 1003 may include volatile and nonvolatile, removable and non-removable media implemented in any method or technology for storage of information, such as computer readable instructions, data structures, program modules, or other data.

Examples of storage media include random access memory (RAM), read only memory (ROM), magnetic disks, optical disks, CDs, DVDs, flash memory, solid state memory, phase change memory, 3D-XPoint memory, or any other suitable storage media. Certain implementations may involve either or both virtual memory and non-virtual memory. In no case do storage media consist of a transitory, propagated signal. In addition to storage media, in some implementations, storage system 1003 may also include communication media over which software 1002 may be communicated internally or externally.

Storage system 1003 may be implemented as a single storage device but may also be implemented across multiple storage devices or sub-systems co-located or distributed relative to each other. Storage system 1003 may include additional elements capable of communicating with processing system 1001.

Software 1002 may be implemented in program instructions and, among other functions, may, when executed by device 1000 in general or processing system 1001 in particular, direct device 1000 or processing system 1001 to execute the methods described herein. Software 1002 may implement on device 1000 components, programs, agents, or layers that implement in machine-readable processing instructions 1004 the methods and techniques described herein.

In general, software 1002 may, when loaded into processing system 1001 and executed, transform device 1000 overall from a general-purpose computing system into a special-purpose computing system customized to offer user interface functionality in accordance with the techniques herein. Indeed, encoding software 1002 on storage system 1003 may transform the physical structure of storage system 1003. The specific transformation of the physical structure may depend on various factors in different implementations of this description. Examples of such factors may include, but are not limited to, the technology used to implement the storage media of storage system 1003 and whether the computer-storage media are characterized as primary or secondary storage. Software 1002 may also include firmware or some other form of machine-readable processing instructions executable by processing system 1001. Software 1002 may also include additional processes, programs, or components, such as operating system software and other application software.

Device 1000 may represent any computing system on which software 1002 may be staged and from where software 1002 may be distributed, transported, downloaded, or otherwise provided to yet another computing system for deployment and execution, or yet additional distribution. Device 1000 may also represent other computing systems that may form a necessary or optional part of an operating environment for the disclosed techniques and systems.

A communication interface 1005 may be included, providing communication connections and devices that allow for communication between device 1000 and other computing systems (not shown) over a communication network or collection of networks (not shown) or the air. Examples of connections and devices that together allow for inter-system communication may include network interface cards, antennas, power amplifiers, RF circuitry, transceivers, and other communication circuitry. The connections and devices may communicate over communication media to exchange communications with other computing systems or networks of systems, such as metal, glass, air, or any other suitable communication media. The aforementioned communication media, network, connections, and devices are well known and need not be discussed at length here.

It should be noted that many elements of device 1000 may be included in a system-on-a-chip (SoC) device. These elements may include, but are not limited to, the processing system 1001, a communications interface 1005, and even elements of the storage system 1003 and software 1002.

Alternatively, or in addition, the functionality, methods and processes described herein can be implemented, at least in part, by one or more hardware modules (or logic components). For example, the hardware modules can include, but are not limited to, application-specific integrated circuit (ASIC) chips, field programmable gate arrays (FPGAs), system-on-a-chip (SoC) systems, complex programmable logic devices (CPLDs) and other programmable logic devices now known or later developed. When the hardware modules are activated, the hardware modules perform the functionality, methods and processes included within the hardware modules.

The subject invention includes, but is not limited to, the following exemplified embodiments.

Embodiment 1. A method of element based preview, navigation, organization, and information dissemination comprising:

defining a structure using elements, wherein the elements are three dimensional shapes (although they may be presented two-dimensionally on a flat screen); and manipulating the elements or the structure on a user interface.

Embodiment 2. The method of Embodiment 1, further comprising using a touch screen user interface to manipulate the elements (e.g., to preview the interior of a building).

Embodiment 3. The method of any of Embodiments 1 to 2, further comprising using a key board, or buttons, or a remote means (such as remote controller or mobile device) for manipulating the elements.

Embodiment 4. The method of any of Embodiments 1 to 3, wherein two fingers can separate or move two elements by putting a first finger on a first element and a second finger on a second element and separating the first and second fingers (and may also leave the elements in their final spot after removing the fingers from the touch screen; the elements may move apart, slide relative to each other, or both) or dragging the first and second fingers together (i.e., the elements follow the finger movements so long as the fingers are still in contact with the touch screen).

Embodiment 5. The method of any of Embodiments 1 to 4, wherein a single element, multiple elements, or the entire structure is locked in place (i.e., in a specific relative orientation) and moved and/or rotated horizontally, vertically, or in all three dimensions (e.g., by using the touch screen or by using arrow buttons).

Embodiment 6. The method of any of Embodiments 1 to 5, wherein one or more elements can be moved by placing a finger on each of the elements and moving the finger on the touch screen.

Embodiment 7. The method of any of Embodiments 1 to 6, wherein the elements can be selected by using a remote icon (e.g., a categorized list that is adjacent to the structure and elements).

Embodiment 8. The method of any of Embodiments 1 to 7, further comprising a legend that shows scale (dimensions relative to real-world dimensions).

Embodiment 9. The method of any of Embodiments 1 to 8, wherein the method is implemented in a virtual reality headset.

Embodiment 10. The method of any of Embodiments 1 to 9, wherein gloves or an implement (e.g., a tracking stick or ball, which has magnetometers/accelerometers that detect movement or rotation) are used to detect physical gestures of a user's hand to manipulate the elements or the structure (in all the same ways that can be done using a fingers as mentioned above). For example, the user could separate two elements using fingers and then place the palm between the two elements and further separate the elements using the palm.

Embodiment 11. The method of any of Embodiments 1 to 10, further comprising a button or icon that can return all elements to their original position and/or an icon that can explode the structure or a unit within the structure (separating some or all of its elements; there can be multiple explode icons, e.g., separating the structure by floors (first floor, second floor, etc.; floors can be designated as units, and be comprised of stores, which are designated as elements) or units, and units can be a certain category of stores, e.g., women's clothing, men's apparel, shoes etc.).

Embodiment 12. The method of any of Embodiments 1 to 11, wherein a unit (comprising multiple elements but not the entire structure) can be selected (e.g., by selecting an icon that represents the unit or by choosing multiple elements to form a unit) and the remaining structure is not shown (a unit can be contiguous such as a floor of a cruise ship or shopping center, or non-contiguous such as a group men's apparel stores in a shopping center or dining options/restaurants on a cruise ship).

Embodiment 13. The method of any of Embodiments 1 to 12, wherein a user's location within the structure or an element is shown.

Embodiment 14. The method of any of Embodiments 1 to 13, wherein a user can select a destination and directions are provided from the user's current location to the destination (and distances can also be included).

Embodiment 15. The method of any of Embodiments 1 to 14, wherein elements contain sub-elements (e.g., the structure can be a shopping mall, the elements can be stores, and the sub-elements can be departments within the store).

Embodiment 16. The method of any of Embodiments 1 to 15, wherein the structure and/or the elements and/or the sub-elements can be selected and prompted to display additional information about the sub-elements (e.g., product lines within a department, specific brands being sold, price points, or for construction applications information such as type of wood, type of cabinets, crown molding, etc.).

Embodiment 17. The method of any of Embodiments 1 to 16, wherein the method is implemented on a personal device (e.g., a phone, tablet or computer) and/or a public kiosk.

Embodiment 18. The method of any of Embodiments 1 to 17, wherein specific locations within the structure and/or elements can be saved or tagged (and notes can be provided with the tagged item).

Embodiment 19. The method of any of Embodiments 1 to 18, wherein the method is applied to a shopping center or the retail industry (a list of stores organized by category can be adjacent to the structure on the user interface; highlighting a category can highlight all stores (or elements) within that category; selecting a store element can show the departments within the store; further information about the store can be given including the type of store and price category).

Embodiment 20. The method of any of Embodiments 1 to 19, wherein the method is applied to the construction industry (e.g. a general contractor can view elements such as rooms, foundations, kitchen cabinets, windows, doors, floors, stairs, and roofs; information can be displayed including materials of construction, current status of completion by percentage and/or time, date of beginning and ending work, cost of each element of the structure and total cost of the structure; information regarding sub-contractors including contact information; and all of the listed information can be input and changed by a user).

Embodiment 21. The method of any of Embodiments 1 to 20, wherein the structure and/or elements can include photographic textures.

Embodiment 22. The method of any of Embodiments 1 to 21, further comprising displaying the direction a user is traveling.

Embodiment 23. The method of any of Embodiments 1 to 22, further comprising a zoom feature for enlarging or reducing the size of the structure/elements (i.e., a zoom feature).

Embodiment 24. The method of any of Embodiments 1 to 23, further comprising display one or more of restrooms, emergency exits and exit paths, stairs, and elevators within the structure (also, e.g., life boats on a cruise ship).

Embodiment 101: A non-transitory machine-readable storage medium, having encoded thereon an app for a smartphone or another mobile computer device (or a non-mobile device such as a kiosk), general purpose or specialized, said app, when executed by said smartphone or another mobile computer device (or a processor), causes the device to actively present visual information and execute a method according to any of Embodiments 1 to 24.

A greater understanding of the present invention and of its many advantages may be had from the following examples, given by way of illustration. The following examples are illustrative of some of the methods, applications, embodiments and variants of the present invention. They are, of course, not to be considered as limiting the invention. Numerous changes and modifications can be made with respect to the invention.

EXAMPLE 1

Techniques of the present invention can be applied to parking technologies. For example, a business park visitor can use a map service app, which includes user face elements of the present invention as well as a parking recommendation service. The user may have never before visited this particular business park and can requests the app's recommendation regarding a best available parking in one of the adjacent parking garages, and then follow the recommended path to reach it. Without explicit notice the app takes note of the parking position. Later on, as the user has completed her business, she does not remember which parking garage she has parked in. She pulls up the map service app containing the described element, and notices the green marker displayed on a pseudo-perspective depiction of a nearby parking garage. She activates the element by pressing on the green marker. The element opens and depicts an indoor map of the $3^{rd}$ floor of the parking garage, including a marker at the car's position in parking area "3E." With this help, the user now remembers the way to her car. She therefore does not request a path recommendation, but walks back to her car under her own.

EXAMPLE 2

Embodiments of the present invention can be applied to museums and amusement parks. For example, a museum visitor is looking for the department of protoplatonic tilings. She uses her mobile device to bring up an app according to the present invention, which is provided by the museum. A blinking dot on her mobile device indicates her current position. She touches the dot which causes the preview map of the floor to unfold. She studies the layout and finds the desired destination on the same floor, on the other side of the building. Touching the text label describing the destination, the application computes the shortest path to the department, and draws it as part of the interface element. The visitor follows the recommended path to relish in the wonders of antiquity.

EXAMPLE 3

Embodiments of the present invention can be applied to cruise ship entertainment. For example, a cruise ship passenger can use a map application according to the present invention to generate an itinerary or find activities to pursue. She uses a mobile device, or a digital kiosk to quickly explore what the cruise ship has to offer. She is initially presented with a closed view of the ship and a marker depicting her floor-wise location. She decides to explore the floor first, so she taps on her position marker with one finger and the floors slide apart, revealing a map of the floor she is currently on. Some of the floor map is obstructed by the floor above it, so she uses her finger to rotate the entire structure exposing more of the floor of interest. She sees general area labels such as food court, swimming pool, spa, etc. She is interested in the food court, so she taps the food court area, and the floors slide apart more exposing additional information (e.g., restaurants, menus, and hours of operation). Next, she slides the two floors further apart using a two finger gesture in order to expose more detailed information about the area. She picks a particular restaurant and is presented with a shortest path recommendation.

EXAMPLE 4

Embodiments of the present invention can be used in the construction and trade industries. A contractor has the task of completing the interior of units in a multistory apartment building. In order to get a quick overall view of unit completion progress, he uses an app on a tablet to instantly peek into all of the floors of the building. He uses a one finger gesture to slide all of the floors of the building apart in one quick swipe. Every floor is exposed at once. The units are color coded by completion progress levels. He then chooses to see the progress details of one particular unit on one of the exposed floors. He taps on the unit area and is presented with a punch list of the work to be completed.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein (including those in the "References" section, if present) are incorporated by reference in their entirety, including all figures and tables, to the extent they are not inconsistent with the explicit teachings of this specification.

What is claimed is:

1. A method of element based preview, navigation, organization, and information dissemination for a structure, the method comprising:

providing a user interface;

defining the structure using a plurality of elements on the user interface, each element of the plurality elements being a three dimensional shape;

providing the plurality of elements, comprising a first element and a second element, to the user interface, the first element representing a first floor of the structure and the second element representing a second floor of the structure;

separating the first element and the second element using finger gestures to reveal first information about the first floor of the structure and second information about the second floor of the structure, the first element and the second element each being in a perspective view on the user interface, the first element being tilted with respect to a viewing plane of the user interface and a plane of the second element being tilted with respect to the viewing plane of the user interface;

using a finger gesture to change an orientation of the first element up into a top-down view on the user interface, the plane of the first element being in the viewing plane of the user interface;

exploding the plurality of elements so each element of the plurality of elements is separate from each other element of the plurality of elements, when an explode icon is tapped on the user interface; and returning all elements of the plurality of elements back to respective original positions when a return icon is tapped on the user interface, the first element comprising first sub-elements respectively representative of first rooms on the first floor, the second element comprising second sub-elements respectively representative of second rooms on the second floor, the first element further comprising first descriptive text respectively representative of first locations on the first floor, the second element further comprising second descriptive text respectively representative of second locations on the second floor, and the user interface comprising a location marker identifying a current location within the structure of a kiosk having the user interface.

2. The method of claim 1, the user interface being displayed on a touch screen user interface.

3. The method of claim 1, the structure being a shopping center.

4. The method of claim 1, the structure being a building under construction.

5. The method of claim 1, the structure being a cruise ship.

6. The method of claim 1, the structure being a museum.

7. The method of claim 1, the user interface being displayed on a virtual reality headset.

8. The method of claim 1, the structure being a shopping center, the first rooms and the second rooms comprising individual stores, and the first descriptive text and the second descriptive text comprising labels of the individual stores.

9. The method of claim 1, wherein a user's location within the structure is shown on the user interface.

10. The method of claim 9, further comprising providing instructions on the user interface to reach a user selected destination.

11. The method of claim 10, the user interface being displayed on the kiosk, and the kiosk being a public kiosk.

12. The method of claim 1, the user interface being displayed on a virtual reality headset, and the method further comprising separating the first element and the second element via a user's hand or palm.

13. The method of claim 1, the plurality of elements further comprising a third element representing a third floor of the structure, the method further comprising separating the third element and the second element using finger gestures to reveal third information about the third floor of the structure, the third element comprising third sub-elements respectively representative of third rooms on the third floor, and the third element further comprising third descriptive text respectively representative of third locations on the third floor.

14. The method of claim 1, the first sub-elements and the second sub-elements being selectable via a remote icon from a categorized list that is adjacent to the plurality of elements on the user interface.

15. The method of claim 1, the structure being a building under construction, and the first information and second information comprising percent completion, start of work date, end of work date, and cost.

16. The method of claim 1, the structure being a building under construction, the plurality of elements further comprising a third element representing a roof of the structure, and the method further comprising separating the third element and the second element using finger gestures to reveal the second information.

17. The method of claim 1, the user interface further comprising a legend adjacent to the structure and displaying scale of the elements.

18. A method of element based preview, navigation, organization, and information dissemination for a structure, the method comprising:

providing a user interface;

defining the structure using a plurality of elements on the user interface, each element of the plurality of elements being a three dimensional shape;

providing instructions on the user interface to reach a user selected destination;

providing the plurality of elements, comprising a first element, a second element, a third element, and a fourth element, to the user interface, the first element representing a first floor of the structure, the second element representing a second floor of the structure, the third element representing a third floor of the structure, and the fourth element representing a roof of the structure;

separating the first element and the second element using first finger gestures to reveal first information about the first floor of the structure and second information about the second floor of the structure, the first element and the second element each being in a perspective view on the user interface, the first element being tilted with respect to a viewing plane of the user interface and a plane of the second element being tilted with respect to the viewing plane of the user interface;

using a second finger gesture to change orientation of the first element up into a top-down view on the user interface, the plane of the first element being in the viewing plane of the user interface;

separating the third element and the second element using third finger gestures to reveal third information about the third floor of the structure;

exploding the plurality of elements so each element of the plurality of elements is separate from each other element of the plurality of elements, when an explode icon is tapped on the user interface; and returning all elements of the plurality of elements back to respective original positions when a return icon is tapped on the user interface, the first element comprising:
  first sub-elements respectively representative of first rooms on the first floor; and
  first descriptive text respectively representative of first locations on the first floor, the second element comprising:
  second sub-elements respectively representative of second rooms on the second floor; and
  second descriptive text respectively representative of second locations on the second floor, the user interface comprising:
  a location marker identifying a current location within the structure of a kiosk having the user interface; and
  a legend adjacent to the structure and displaying scale of the elements, the structure being a shopping center, a building under construction, a cruise ship, or a museum, the user interface being displayed on a touch screen user interface of the kiosk, the kiosk being a public kiosk, the third element comprising:
  third sub-elements respectively representative of third rooms on the third floor; and
  third descriptive text respectively representative of third locations on the third floor, and the first sub-elements, the second sub-elements, and the third sub-elements being selectable via a remote icon from a categorized list that is adjacent to the plurality of elements on the user interface.

* * * * *